US006864533B2

(12) United States Patent
Yasuhara et al.

(10) Patent No.: US 6,864,533 B2
(45) Date of Patent: Mar. 8, 2005

(54) MOS FIELD EFFECT TRANSISTOR WITH REDUCED ON-RESISTANCE

(75) Inventors: Norio Yasuhara, Kawasaki (JP); Akio Nakagawa, Fujisawa (JP); Yusuke Kawaguchi, Miura-gun (JP); Kazutoshi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/949,646

(22) Filed: Sep. 12, 2001

(65) Prior Publication Data

US 2002/0030226 A1 Mar. 14, 2002

(30) Foreign Application Priority Data

Sep. 11, 2000 (JP) ........................................ 2000-275029

(51) Int. Cl.$^7$ .............................................. H01L 29/76
(52) U.S. Cl. .................. 257/342; 257/401; 257/328; 257/329; 257/344; 257/408; 257/330; 257/331; 257/332; 257/343; 257/334; 257/335; 257/336; 257/337; 257/345; 257/339; 257/341; 257/342; 257/195; 257/141; 257/346; 438/282
(58) Field of Search ................................. 257/339, 345

(56) References Cited

U.S. PATENT DOCUMENTS

| 4,794,432 | A | * | 12/1988 | Yilmaz et al. | ............... | 257/337 |
| 5,155,563 | A | * | 10/1992 | Davies et al. | ............... | 257/327 |
| 5,929,488 | A | | 7/1999 | Endou | | |
| 5,932,897 | A | | 8/1999 | Kawaguchi et al. | | |
| 6,002,154 | A | | 12/1999 | Fujita | | |
| 6,297,533 | B1 | * | 10/2001 | Mkhitarian | ................. | 257/336 |
| 6,365,915 | B1 | * | 4/2002 | Hirai et al. | .................... | 257/59 |
| 6,369,425 | B1 | * | 4/2002 | Ferla et al. | ................. | 257/341 |

FOREIGN PATENT DOCUMENTS

| JP | 4-18762 | 1/1992 |
| JP | 5-121739 | 5/1993 |
| JP | 6-97447 | 4/1994 |
| JP | 6-151846 | 5/1994 |
| JP | 8-227998 | 9/1996 |

OTHER PUBLICATIONS

Isao Yoshida, et al., "Highly Efficient 1.5GHz Si Power MOSFET for Digital Cellular Front End", Proceedings of 1992 International Symposium on Power Semiconductor Devices & ICs, Tokyo, 1992, pp. 156–157.

Shuming Xu, et al., "RF LDMOS with Extreme Low Parasitic Feedback Capacitance and High Hot–Carrier Immunity", Tech. Dig. International Electron Devices Meeting, 1999, pp. 201–204.

* cited by examiner

*Primary Examiner*—Eddie Lee
*Assistant Examiner*—Junghwa Im
(74) *Attorney, Agent, or Firm*—Oblon, Spivak, McClelland, Maier & Neustadt, P.C.

(57) ABSTRACT

A semiconductor substrate includes a first principal plane and a second principal plane opposite this first principal plane. A first semiconductor region is formed on the first principal plane of the semiconductor substrate. Second and third semiconductor regions are formed separately from each other on the first semiconductor region. A gate electrode is formed, via a gate insulator, on the first semiconductor region between the second semiconductor region and the third semiconductor region. An electric conductor is formed up to the semiconductor substrate from the second semiconductor region and electrically connects the second semiconductor region with the semiconductor substrate. A first main electrode is formed on the second principal plane of the semiconductor substrate and is electrically connected to the semiconductor substrate. A second main electrode is formed on the first semiconductor region via insulators and is electrically connected to the third semiconductor region.

8 Claims, 21 Drawing Sheets

MOS FIELD EFFECT TRANSISTOR WITH REDUCED ON-RESISTANCE

CROSS-REFERENCE TO RELATED APPLICATIONS

This application is based upon and claims the benefit of priority from the prior Japanese Patent Application No. 2000-275029, filed Sep. 11, 2000, the entire contents of which are incorporated herein by reference.

BACKGROUND OF THE INVENTION

1. Field of the Invention

The present invention relates to a low-resistance MOS field effect transistor (hereafter referred to as MOSFET) used for power circuits and the like based on the synchronous rectification.

2. Description of the Related Art

In recent years, power circuits based on the synchronous rectification are extensively used according as a low-voltage power is used for CPUs in computers and the like. This power circuit conventionally uses a trench MOSFET having the trench gate structure.

A conventional low-resistance MOSFET is described with reference to FIGS. 1A and 1B.

FIG. 1A is a sectional view showing a configuration of a conventional trench MOSFET. The trench MOSFET comprises a gate electrode 201, a source electrode 202, and a drain electrode 203. To achieve low on-resistance, this trench MOSFET employs a trench gate which uses as a channel the side wall of a trench buried with the gate electrode 201.

However, the trench MOSFET in FIG. 1A allows the gate electrode 201 to directly contact with a drain layer 205 through the intermediation of a thin oxide film 204, causing a large parasitic capacitance between the gate electrode 201 and the drain layer 205. Accordingly, that trench MOSFET is inappropriate for high-frequency switching.

A planar MOSFET as shown in FIG. 1B is used as a high-speed switching element suitable for the high-frequency switching. This planar MOSFET has a gate electrode 211, a source electrode 212, and a drain electrode 213. However, the planar MOSFET offers a problem of large on-resistance.

When the MOSFET is used under an inductive load, there is a disadvantageous effect that applying a voltage exceeding the element's withstand voltage causes avalanche breakdown and destroys the element.

BRIEF SUMMARY OF THE INVENTION

A MOS field effect transistor according to an aspect of the present invention comprises a semiconductor substrate of first conductive type having a first principal plane and a second principal plane opposite this first principal plane; a first semiconductor region of first conductive type formed on the first principal plane of the semiconductor substrate; second and third semiconductor regions of second conductive type each other separately formed in the first semiconductor region; a gate electrode formed, via a gate insulator, on the first semiconductor region between the second semiconductor region and the third semiconductor region; an electric conductor formed up to the semiconductor substrate from the second semiconductor region, wherein the electric conductor electrically connects the second semiconductor region with the semiconductor substrate; a first main electrode formed on the second principal plane of the semiconductor substrate, wherein the first main electrode is electrically connected to the semiconductor substrate; and a second main electrode formed on the first semiconductor region via an insulator, wherein the second main electrode is electrically connected to the third semiconductor region.

DETAILED DESCRIPTION OF THE INVENTION

Embodiments of the present invention will be described in further detail with reference to the accompanying drawings.

First Embodiment

Figure 2:
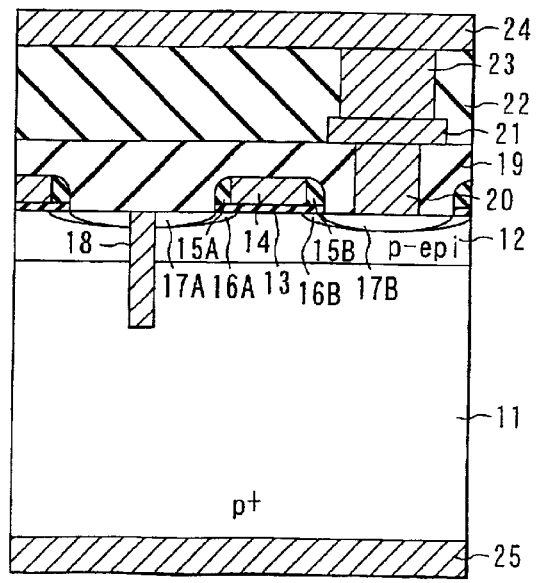
FIG. 2 is a sectional view showing a configuration of a MOS field effect transistor (MOSFET) according to a first embodiment of the present invention.

FIG. 2 is a sectional view showing a configuration of an unit cell of a MOS field effect transistor (MOSFET) according to a first embodiment of the present invention.

As shown in FIG. 2, a p− type silicon epitaxial layer (hereafter referred to as the p− type epitaxial layer) 12 is formed on one principal plane of a p+ type silicon semiconductor substrate (hereafter referred to as the p+ type semiconductor substrate) 11. On the p− type epitaxial layer 12, there is formed a gate electrode 14 intermediated by a gate insulator 13. A sidewall insulator 15A is formed on one end of the side of the gate electrode 14. A sidewall insulator 15B is formed on the other end thereof. The gate insulator 13 comprises, for example, a silicon oxide film. The gate electrode 14 comprises, for example, a polysilicon film.

There are formed an n type diffusion region 16A and an n+ type diffusion region 17A as source regions in the p− type epitaxial layer 12 at one end of the side of the gate electrode 14. The n+ type diffusion region 17A is connected to a p+ type semiconductor substrate 11 by a contact plug 18 comprising a conductive layer buried in a trench in the p− type epitaxial layer 12. The contact plug 18 need not be a conductive layer buried in the trench and may be an impurity diffusion region formed by doping impurities through the use of ion implantation into the p− type epitaxial layer 12.

The contact plug 18 uses a metal layer (for example, tungsten) or a low-resistance semiconductor layer. For example, the semiconductor layer is formed by embedding a semiconductor doped with impurities in the trench. When a low-resistance semiconductor layer is used, a metal layer needs to be provided on this semiconductor layer. The purpose is to eliminate a junction formed by the semiconductor layer and the n+ type diffusion region 17A and to electrically connect the semiconductor layer with the n+ type diffusion region 17A. There are formed an n type diffusion region 16B and an n+ type diffusion region 17B as drain regions in the p− type epitaxial layer 12 at the other end of the side of the gate electrode 14.

An insulation layer 19 is formed on the p− type epitaxial layer 12 including the n+ type diffusion regions 17A and 17B and on the gate electrode 14. In the insulation layer 19 on the n+ type diffusion region 17B, there is formed a contact plug 20 comprising a conductive layer (for example, tungsten). On the contact plug 20, a first-layer drain electrode pattern (for example, aluminum) 21 is formed.

An insulation layer 22 is formed on the drain electrode pattern 21 and the insulation layer 19. In the insulation layer 22 on the drain electrode pattern 21, there is formed a contact plug 23 comprising a conductive layer (for example, tungsten). A second-layer drain electrode (for example, aluminum) 24 is formed on the contact plug 23 and the insulation layer 22.

The drain electrode 24 is connected to the n+ type diffusion region 17B intermediated by the contact plug 23, the drain electrode pattern 21, and the contact plug 20. A source electrode 25 is formed on the other principal plane of the p+ type semiconductor substrate 11. Instead of the p− type epitaxial layer 12, it may be preferable to use a p type well layer formed on the n type epitaxial layer.

Figure 3:
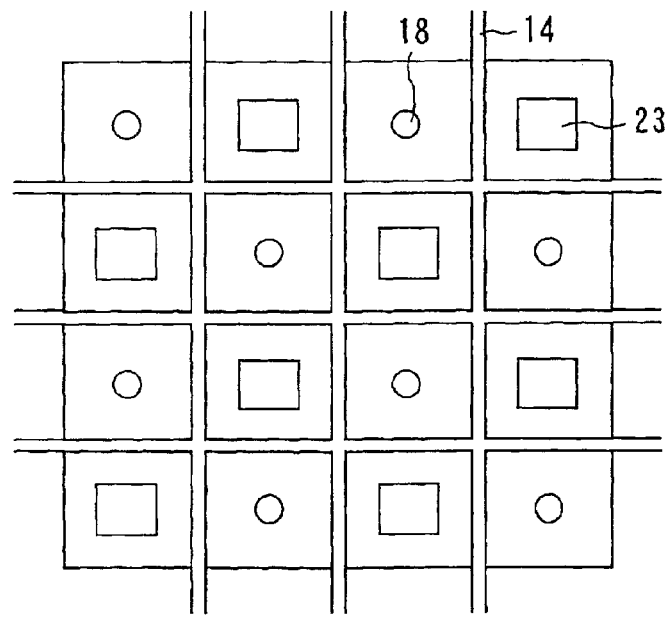
FIG. 3 is a top plan view showing a layout of the MOSFET according to the first embodiment of the present invention.

The thus configured MOSFET is an nMOS structure transistor constituting a so-called CMOS chip. FIG. 3 is a top plan view showing a layout of the MOSFET, revealing the contact plug (source trench contact) 18, the contact plug (drain contact hole) 23, and the gate electrode 14. FIG. 3 shows an alternate arrangement of the contact plug 18 connected to the source electrode 25 and the contact plug 23 connected to the drain electrode 24. This arrangement can increase a gate width W formed on the MOSFET and decrease an on-resistance.

Figure 1A:
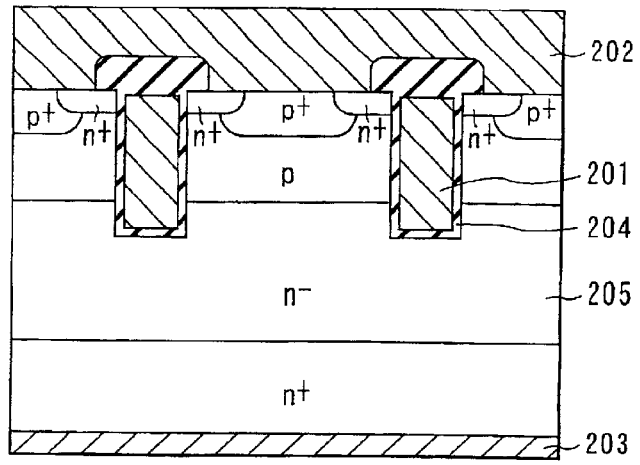
FIG. 1A is a sectional view showing a configuration of a conventional trench MOSFET.
Figure 1B:
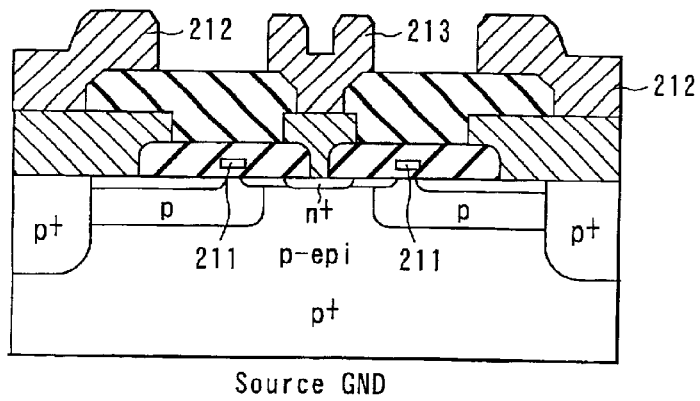
FIG. 1B is a sectional view showing a configuration of a conventional planar MOSFET.

The MOSFET according to this embodiment shown in FIG. 2 forms the drain electrode 24 and the source electrode 25 on both sides of the wafer's principal plane. A current flows from one principal plane to the other of the wafer, eliminating voltage drop due to a metal wiring resistance which may occur on the device as shown in FIG. 1B. Namely, it is possible to decrease resistance during a power-on state (decreasing on-resistance).

The device in FIG. 1B uses the p+ type diffusion region to connect the source layer with the semiconductor substrate. This causes an unnegligible area of the p+ type diffusion region connecting the source layer and the semiconductor substrate, enlarging a repetitive cell pitch and increasing the element resistance.

The MOSFET according to this embodiment connects the n+ type diffusion region 17A as a source layer with the p+ type semiconductor substrate 11 by forming a trench and embedding a conductive film, for example, a metal film. This can decrease resistance between the source layer and the semiconductor substrate.

Owing to these characteristics, the MOSFET according to this embodiment features low resistance of a vertical trench MOSFET as well as high speed of a planar MOSFET.

As mentioned above, the first embodiment can decrease the on-resistance by providing the drain electrode and the source electrode on both sides of the wafer's principal plane and using the conductive film buried in the trench for connection between the source region and the semiconductor substrate. Further, it is possible to suppress a switching loss at a high frequency from increasing by decreasing the parasitic capacitance between the gate and the drain.

Second Embodiment

In addition to the configuration of the first embodiment, the second embodiment provides a configuration for increasing ruggedness to avalanche breakdown. The ruggedness to avalanche breakdown (current) means that the MOSFET can not be destroyed even when The avalanche breakdown occurs. The second embodiment does not provide the n type diffusion regions 16A and 16B and the sidewall insulators 15A and 15B, and uses a single-layer insulator on the p– type epitaxial layer 12. However, the basic structure is same as for the first embodiment. Further, it may be preferable to use the p type well layer formed in the n type epitaxial layer instead of the p– type epitaxial layer 12. The purpose is to prevent the MOSFET from being destroyed due to a possible voltage exceeding the withstand voltage when the semiconductor device according to the first embodiment performs switching under inductive load.

Figure 4:
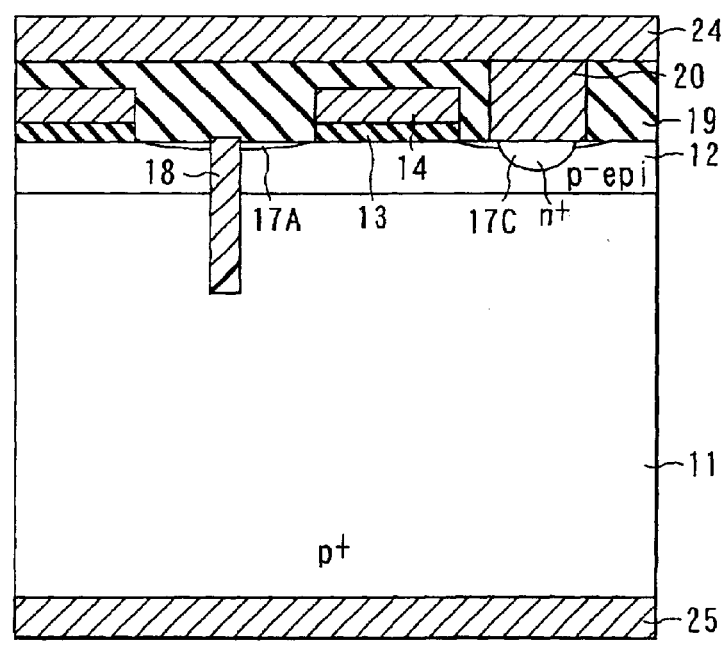
FIG. 4 is a sectional view showing a configuration of the MOSFET according to a second embodiment of the present invention.

FIG. 4 is a sectional view showing a configuration of the MOSFET according to the second embodiment of the present invention.

There is a withstand voltage for the vertical diode formed by an n+ type diffusion region 17C as a drain region and the p+ type semiconductor substrate 11. The above-mentioned MOSFET sets this withstand voltage lower than a withstand voltage between the drain and the source of the planar MOSFET, namely a withstand voltage between the n+ type diffusion region 17C and the n+ type diffusion region 17A.

Specifically, as shown in FIG. 4, the n+ type diffusion region 17C as a drain region is formed deeper than the n+ type diffusion region 17B according to the above-mentioned first embodiment. This shortens a distance between the n+ type diffusion region 17C and the p+ type semiconductor substrate 11. This structure allows a voltage applied to the MOSFET to be clamped by a vertical parasitic diode comprising the n+ type diffusion region 17C and the p+ type semiconductor substrate 11. This prevents a large voltage from being applied to a MOSFET channel.

According to the second embodiment, a large voltage generated during switching is applied to the vertical diode comprising the n+ type diffusion region (drain region) and the p+ type semiconductor substrate, not to a channel. This prevents the MOSFET from being destroyed.

Third Embodiment

The third embodiment provides a higher withstand voltage than that for the second embodiment.

Figure 5:
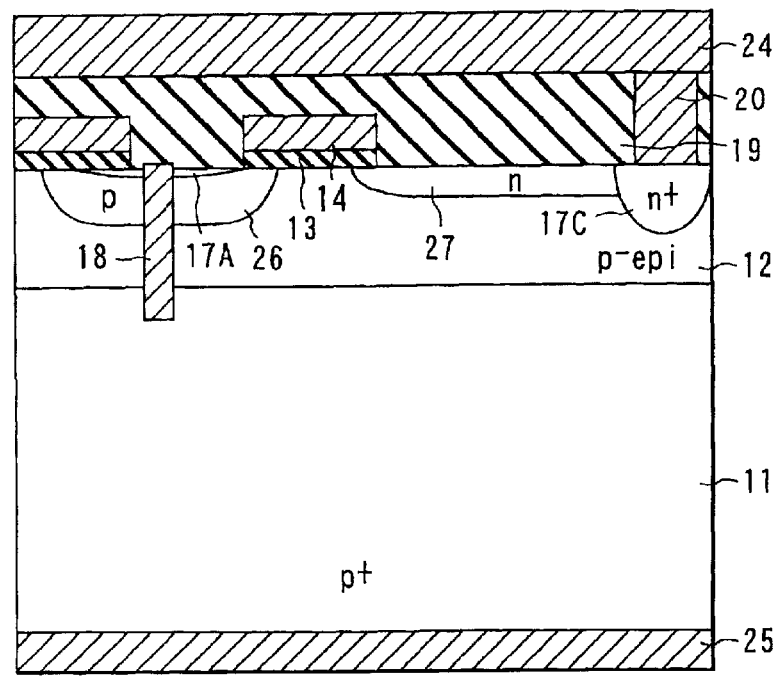
FIG. 5 is a sectional view showing a configuration of the MOSFET according to a third embodiment of the present invention.

FIG. 5 is a sectional view showing a configuration of the MOSFET according to the third embodiment of the present invention.

As shown in FIG. 5, the p– type epitaxial layer (or n– type epitaxial layer) 12 is formed on one principal plane of the p+ type semiconductor substrate 11. On the p– type epitaxial layer 12, there is formed the gate electrode 14 intermediated by the gate insulator 13. The gate insulator 13 comprises, for example, a silicon oxide film. The gate electrode 14 comprises, for example, a polysilicon film.

There is formed a p type well region 26 in the p– type epitaxial layer 12 at one end of the side of the gate electrode 14. On the p type well region 26, there is formed the n+ type diffusion region 17A as a source region. The n+ type diffusion region 17A is connected to a p+ type semiconductor substrate 11 by a contact plug 18 comprising a conductive layer buried in a trench in the p– type epitaxial layer 12.

The contact plug 18 uses a metal layer (for example, tungsten) or a low-resistance semiconductor layer. When a low-resistance semiconductor layer is used, a metal layer needs to be provided on this semiconductor layer. The purpose is to eliminate a junction formed by the semiconductor layer and the n+ type diffusion region 17A and to electrically connect the semiconductor layer with the n+ type diffusion region 17A.

Figure 6:
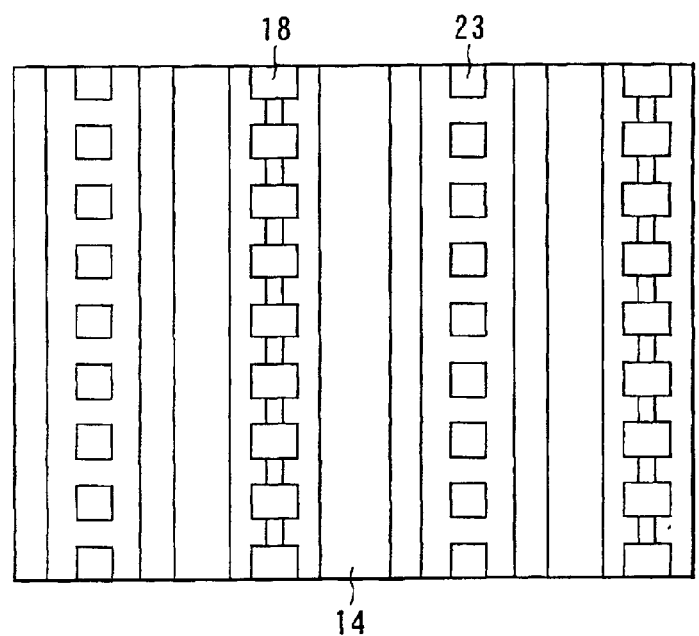
FIG. 6 is a top plan view showing a layout of the MOSFET according to the third embodiment of the present invention.

There are formed an n type RESURF layer 27 and the n+ type diffusion region 17C as drain regions in the p-type epitaxial layer 12 at the other end of the side of the gate electrode 14. On this structure, the insulation layer 19 is formed. The contact plug 20 comprising a conductive layer (for example, tungsten) is formed in the insulation layer 19 on the n+ type diffusion region 17C. The drain electrode 24 is formed on the contact plug 20. The drain electrode 24 is connected to the n+ type diffusion region 17C through an intermediate of the contact plug 20. The source electrode 25 is formed on the other principal plane of the p+ type semiconductor substrate 11. FIG. 6 is a top plan view showing a layout of the MOSFET, revealing the contact plug (source contact) 18, the contact plug (drain contact) 23, and the gate electrode 14.

By providing the drain with the n type RESURF layer 27, this MOSFET enables a higher withstand voltage than that for the above-mentioned second embodiment. There is a withstand voltage for the vertical diode formed by the n+ type diffusion region 17C as a drain region and the p+ type semiconductor substrate 11. The MOSFET sets this withstand voltage lower than a withstand voltage between the drain and the source of the MOSFET, namely a withstand voltage between the n type RESURF layer 27 and the n+ type diffusion region 17A. Further, the n type RESURF layer 27 is formed between the n+ type diffusion region 17C as a drain region and the channel.

This structure allows a voltage applied to the MOSFET to be clamped by a vertical parasitic diode comprising the n+ type diffusion region 17C and the p+ type semiconductor substrate 11. This prevents a large voltage from being applied to a MOSFET channel. Since the n type RESURF layer 27 is provided on the drain side, a depletion layer is easily formed in the drain region. It is possible to increase a withstand voltage between the drain and the source of the MOSFET.

According to the third embodiment as mentioned above, a large voltage generated during switching is applied to the vertical diode comprising the n+ type diffusion region (drain region) and the p+ type semiconductor substrate, not to the channel. Further, a high withstand voltage can be provided between the drain region and the source region. Consequently, it is possible to prevent the MOSFET from being destroyed.

Figure 7:
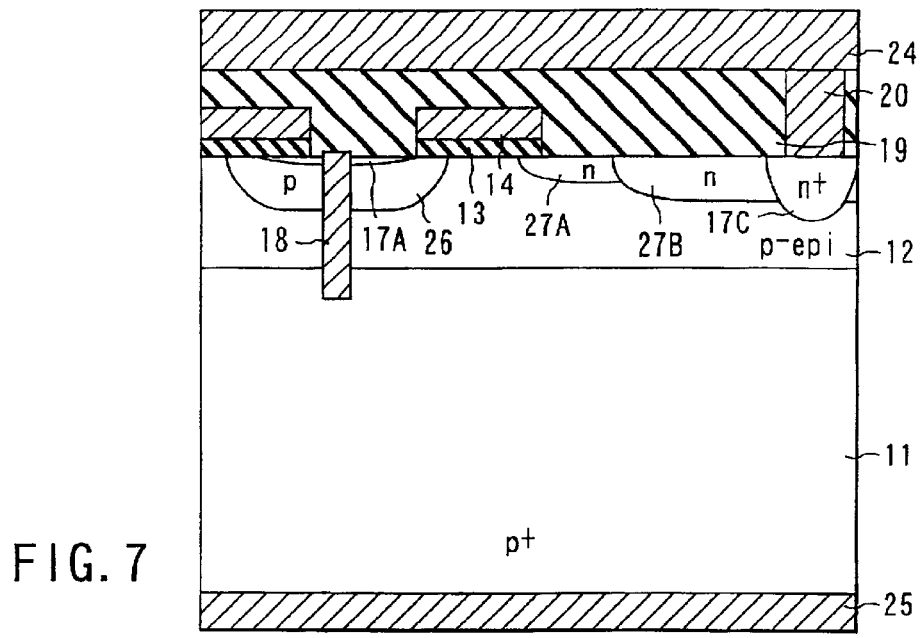
FIG. 7 is a sectional view showing a configuration of the MOSFET as a modification according to the third embodiment of the present invention.

FIG. 7 is a sectional view showing a configuration of the MOSFET as a modification according to the third embodiment of the present invention.

In this MOSFET, the n type RESURF layer 27 provided on the drain side is replaced by 2-stage n type RESURF layers 27A and 27B. The other parts of the configuration are same as those for the third embodiment.

Figure 8:
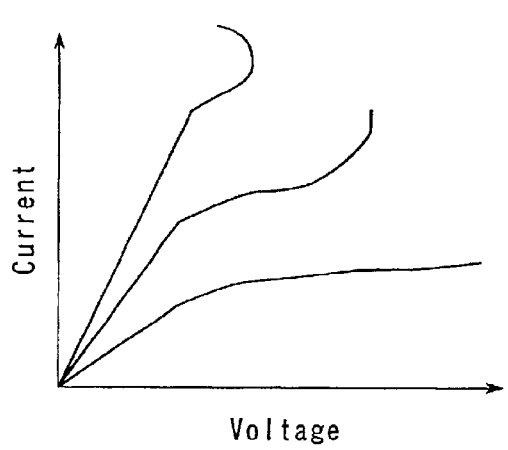
FIG. 8 shows current-voltage characteristics when a current is applied to the conventional MOSFET.
Figure 9:
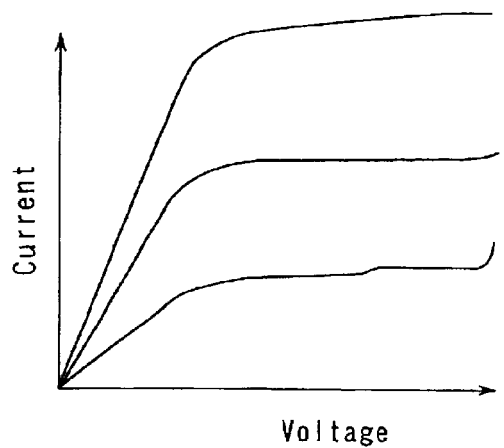
FIG. 9 shows current-voltage characteristics when a current is applied to the MOSFET as the modification according to the third embodiment of the present invention.

Generally, the withstand voltage lowers as shown in FIG. 8 when a current is applied to the MOSFET. Even when a current flows, the MOSFET in FIG. 7 can provide a high withstand voltage as shown in FIG. 9 by setting the impurity concentration for the n type RESURF layer 27B higher than that for the n type RESURF layer 27A. For example, the total dose of impurities existing in the n type RESURF layer 27A is approximately $1\times10^{11}$ to $5\times10^{12}$ cm$^{-2}$. It is desirable to set the total dose of impurities existing in the n type RESURF layer 27B approximately to $2\times10^{12}$ to $1\times10^{13}$ cm$^{-2}$.

The MOSFET in FIG. 5 according to the third embodiment can also increase the withstand voltage with the current flowing by setting the dose for the n type RESURF layer 27 to $2\times10^{12}$ to $1\times10^{13}$ cm$^{-2}$.

According to the modification of the third embodiment as mentioned above, a large voltage generated during switching etc. is applied to the vertical diode comprising the n+ type diffusion region (drain region) and the p+ type semiconductor substrate, not to the channel. Further, a high withstand voltage can be provided between the drain region and the source region. Consequently, it is possible to prevent the MOSFET from being destroyed. Moreover, it is possible to improve the withstand voltage when a current is applied to the MOSFET.

Fourth Embodiment

The fourth embodiment replaces the p+ type semiconductor substrate with an n+ type semiconductor substrate, and accordingly changes conductive types for the other layers.

Figure 10:
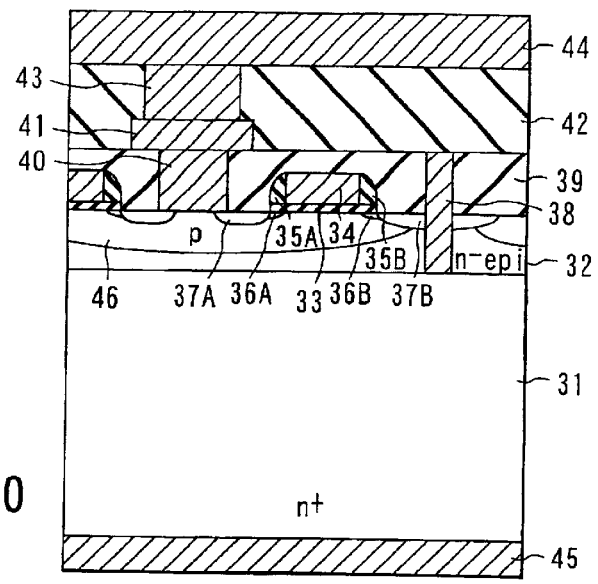
FIG. 10 is a sectional view showing a configuration of the MOSFET according to a fourth embodiment of the present invention.

FIG. 10 is a sectional view showing a configuration of the MOSFET according to the fourth embodiment of the present invention.

As shown in FIG. 10, an n– type epitaxial layer (or p– type epitaxial layer) 32 is formed on one principal plane of an n+ type silicon semiconductor substrate (hereafter referred to as the n+ type semiconductor substrate) 31. In this n– type epitaxial layer 32, a p type well layer 46 is selectively formed. On the p type well layer 46, a gate electrode 34 is formed via a gate insulator 33. A sidewall insulator 35A is formed at one end on the side of the gate electrode 34. A sidewall insulator 35B is formed at the other end on the side thereof. The gate insulator 33 comprises, for example, a silicon oxide film. The gate electrode 34 comprises, for example, a polysilicon film.

There are formed an n type diffusion region 36A and an n+ type diffusion region 37A as source regions at one end on the side of the gate electrode 34 in the p type well layer 46. There are formed an n type diffusion region 36B and an n+ type diffusion region 37B as drain regions at the other end on the side of the gate electrode 34.

Further, an insulation layer 39 is formed on this structure. A contact plug 40 comprising a conductive layer (for example, tungsten) is formed in the insulation layer 39 on the n+ type diffusion region 37A. On this contact plug 40, there is formed a first source electrode pattern 41 (for example, aluminum).

An insulation layer 42 is formed on the source electrode pattern 41 and the insulation layer 39. A contact plug 43 comprising a conductive layer (for example, tungsten) is formed in the insulation layer 42 on the source electrode pattern 41. A second source electrode 44 is formed on the contact plug 43 and the insulation layer 42. The source electrode 44 is connected to the n+ type diffusion region 37A via the contact plug 43, the source electrode pattern 41, and the contact plug 40.

The n+ type diffusion region 37B is connected to the n type semiconductor substrate 31 by the contact plug 38 comprising a conductive layer buried in a trench in the insulation layer 39 and the n– type epitaxial layer 32.

The contact plug 38 uses a metal layer (for example, tungsten) or a low-resistance semiconductor layer. A drain electrode 45 is formed on the other principal plane of the n+ type semiconductor substrate 31.

The fourth embodiment provides the same effects as for the first embodiment. The fourth embodiment can further decrease the resistance during a power-on state because the n+ type semiconductor substrate provides a lower substrate resistance than the p+ type semiconductor substrate.

Fifth Embodiment

The technique for improving the ruggedness to avalanche current described in the second embodiment is applicable to not only a vertical element whose source electrode and drain electrode are provided on both principal planes of the substrate, but also a planar MOSFET as output means for a power IC chip.

The technique for improving the ruggedness to avalanche current designs a withstand voltage between the drain and the source, with the gate voltage set to zero, to be higher than a withstand voltage for the vertical diode comprising a p type base layer and an n+ type buried layer. To do this, the following methods are available.

A deep p type diffusion region is provided on the p type base layer. A distance between the gate and the drain is increased to form the n type RESURF layer comprising two layers with different impurity concentration. An antimony buried layer is used for CMOS and bipolar transistors, and phosphorus is introduced into the buried layer of a power MOS transistor isolated by a pn junction to diffuse the buried layer upward and practically thin the low impurity concentration epitaxial layer.

The following describes an example of applying the technique for improving the ruggedness to avalanche current to a planar MOSFET.

Figure 11:
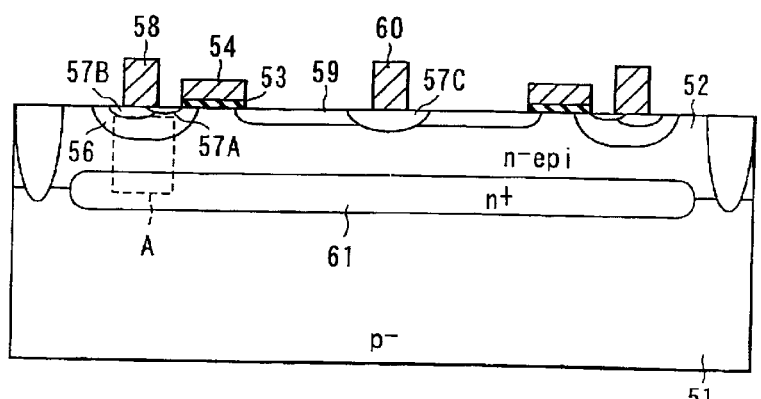
FIG. 11 is a sectional view showing a configuration of the MOSFET according to a fifth embodiment of the present invention.

FIG. 11 is a sectional view showing a configuration of the MOSFET according to the fifth embodiment of the present invention.

As shown in FIG. 11, an n− type epitaxial layer 52 is formed on a p− type semiconductor substrate 51. On the n− type epitaxial layer 52, a gate electrode 54 is formed via a gate insulator 53. The gate insulator 53 comprises, for example, a silicon oxide film. The gate electrode 54 comprises, for example, a polysilicon film.

A p type well layer (p type base layer) 56 is formed in the n− type epitaxial layer 52 to one side of the gate electrode 54. On the p type well layer 56, there are formed a p+ type base layer 57B and an n+ type diffusion region 57A as a source region. A source electrode 5B is formed on the n+ type diffusion region 57A and the p+ type base layer 57B.

There are formed an n type RESURF layer 59 as a drain region and an n+ type diffusion region 57C in the n− type epitaxial layer 52 to the other side of the gate electrode 54. A drain electrode 60 is formed on the n+ type diffusion region 57C. An n+ type buried layer 61 is formed on the boundary between the p− type semiconductor substrate 51 and the n− type epitaxial layer 52.

A vertical diode is formed in a location indicated by A in FIG. 11. The MOSFET sets a withstand voltage for this vertical diode lower than a withstand voltage between the n type RESURF layer (drain region) 59 and the n+ type diffusion region (source region) 57A. The vertical diode comprises the p type well layer (p type base layer) 56, the n− type epitaxial layer 52, and the n+ type buried layer 61. This structure allows a voltage applied to the MOSFET to be clamped by the vertical diode, preventing a large voltage from being applied to the MOSFET channel.

In other words, when determining a withstand voltage for the planar MOSFET in FIG. 11, a withstand voltage between the drain and the source, with the gate voltage set to zero, is designed to be higher than a withstand voltage for the vertical diode. This design prevents the MOSFET from being destroyed due to avalanche breakdown when an overvoltage is applied.

According to the fifth embodiment as mentioned above, a large voltage generated during switching etc. is applied to the vertical diode comprising the p type well layer (p type base layer) and the n+ type buried layer, not to the channel. Further, providing a RESURF layer allows to maintain a high withstand voltage between the drain region and the source region. Consequently, it is possible to prevent the MOSFET from being destroyed.

Figure 12:
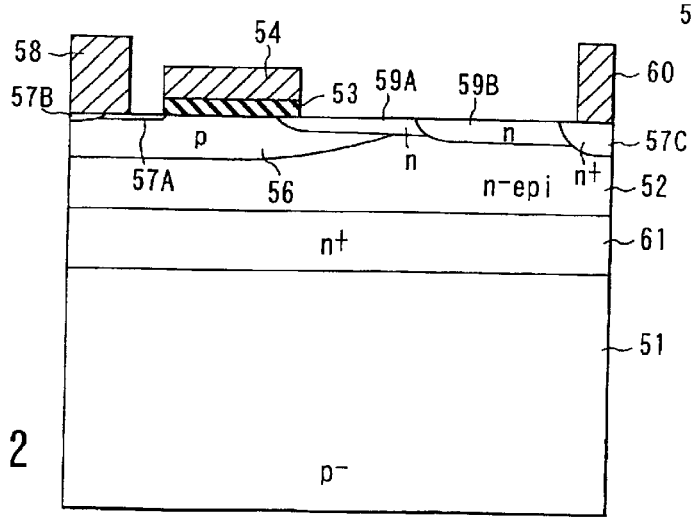
FIG. 12 is a sectional view showing a configuration of the MOSFET as a first modification according to the fifth embodiment of the present invention.

FIG. 12 is a sectional view showing a configuration of the MOSFET as a first modification according to the fifth embodiment of the present invention.

This MOSFET replaces the n type RESURF layer 59 provided on the drain side in the fifth embodiment with two-stage n type RESURF layers 59A and 59B. Further, the p type well layer (p type base layer) 56 is extended to overlap with the n type RESURF layer 59A.

As mentioned in the modification of the third embodiment, the withstand voltage generally lowers as shown in FIG. 8 when a current is applied to the MOSFET. Even when a current flows, the MOSFET in FIG. 12 can provide a high withstand voltage as shown in FIG. 9 by setting the impurity concentration for the n type RESURE layer 59B higher than that for the n type RESURF layer 59A. For example, the total dose of impurities existing in the n type RESURF layer 59A is approximately $1\times10^{11}$ to $5\times10^{12}$ cm$^{-2}$. It is desirable to set the total dose of impurities existing in the n type RESURF layer 59B approximately to $2\times10^{12}$ to $1\times10^{13}$ cm$^{-2}$.

The MOSFET in FIG. 11 according to the fifth embodiment can also increase the withstand voltage with the current flowing by setting the dose for the n type RESURF layer 59 to $2\times10^{12}$ to $1\times10^{13}$ cm$^{-2}$.

To provide a large current, it is necessary to form a configuration by symmetrically duplicating the configuration in FIG. 12. Namely, it is necessary to form a plurality of elements in FIG. 12.

According to the first modification in FIG. 12 as mentioned above, a large voltage generated during switching etc. is applied to the vertical diode comprising the p type well layer (p type base layer) and the n+ type buried layer, not to the channel. Further, a high withstand voltage can be provided between the drain region and the source region. Consequently, it is possible to prevent the MOSFET from being destroyed. Moreover, it is possible to improve the withstand voltage when a current is applied to the MOSFET.

Figure 13:
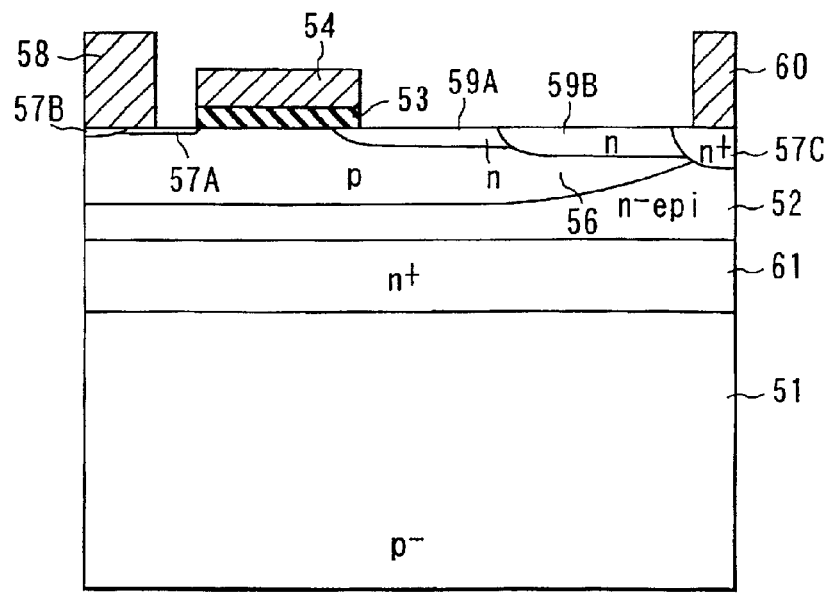
FIG. 13 is a sectional view showing a configuration of the MOSFET as a second modification according to the fifth embodiment of the present invention.

FIG. 13 is a sectional view showing a configuration of the MOSFET as a second modification according to the fifth embodiment of the present invention.

Compared to the first modification in FIG. 12, the MOSFET in FIG. 13 further extends the p type well layer (p type base layer) 56 to overlap with the n type RESURF layer 59B. Even when a current flows, this MOSFET also can provide a high withstand voltage as shown in FIG. 9 by setting the impurity concentration for the n type RESURF layer 59b higher than that for the n type RESURF layer 59A. For example, the total dose of impurities existing in the n type RESURF layer 59A is approximately $1\times10^{11}$ to $5\times10^{12}$ cm$^{-2}$. It is desirable to set the total dose of impurities existing in the n type RESURF layer 59B approximately to $2\times10^{12}$ to $1\times10^{13}$ cm$^{-2}$.

To provide a large current, it is necessary to form a configuration by symmetrically duplicating the configuration in FIG. 13. Namely, it is necessary to form a plurality of elements in FIG. 13.

According to the second modification in FIG. 13 as mentioned above, a large voltage generated during switching etc. is applied to the vertical diode comprising the p type well layer (p base layer) and the n+ type buried layer, not to the channel. Further, a high withstand voltage can be provided between the drain region and the source region. Consequently, it is possible to prevent the MOSFET from being destroyed. Moreover, it is possible to improve the withstand voltage when a current is applied to the MOSFET.

Figure 14:
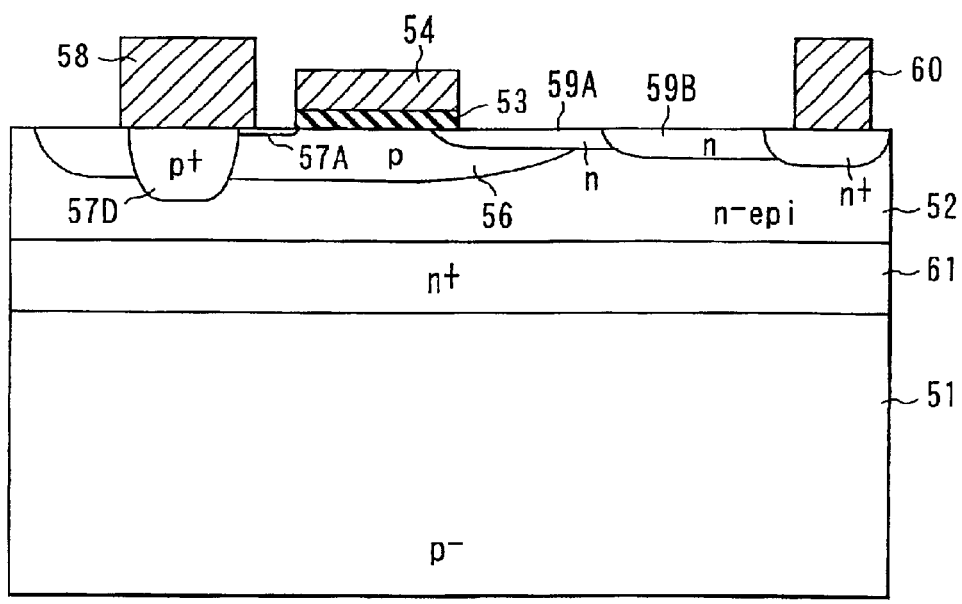
FIG. 14 is a sectional view showing a configuration of the MOSFET as a third modification according to the fifth embodiment of the present invention.

FIG. 14 is a sectional view showing a configuration of the MOSFET as a third modification according to the fifth embodiment of the present invention.

This MOSFET provides a deep p+ type base layer 57D instead of the shallow p+ type base layer 57B in the first modification of the fifth embodiment. A vertical diode is formed by the p+ type base layer 57D, the n-type epitaxial layer 52, and the n+ type buried layer 61. The MOSFET makes it easy to set a withstand voltage of the vertical diode lower than a withstand voltage between the n type RESURF layer (drain region) 59A and the n+ type diffusion region (source region) 57A. This structure allows a voltage applied to the MOSFET to be clamped by the vertical diode, preventing a large voltage from being applied to the MOSFET channel.

As mentioned above, the first to fifth embodiments can decrease switching losses at a high frequency and provide a MOSFET with low on-resistance. Further, it is possible to provide a MOSFETs capable of improving the ruggedness to avalanche current.

Sixth Embodiment

The following describes the MOSFET according to the sixth embodiment of the present invention.

Figure 15:
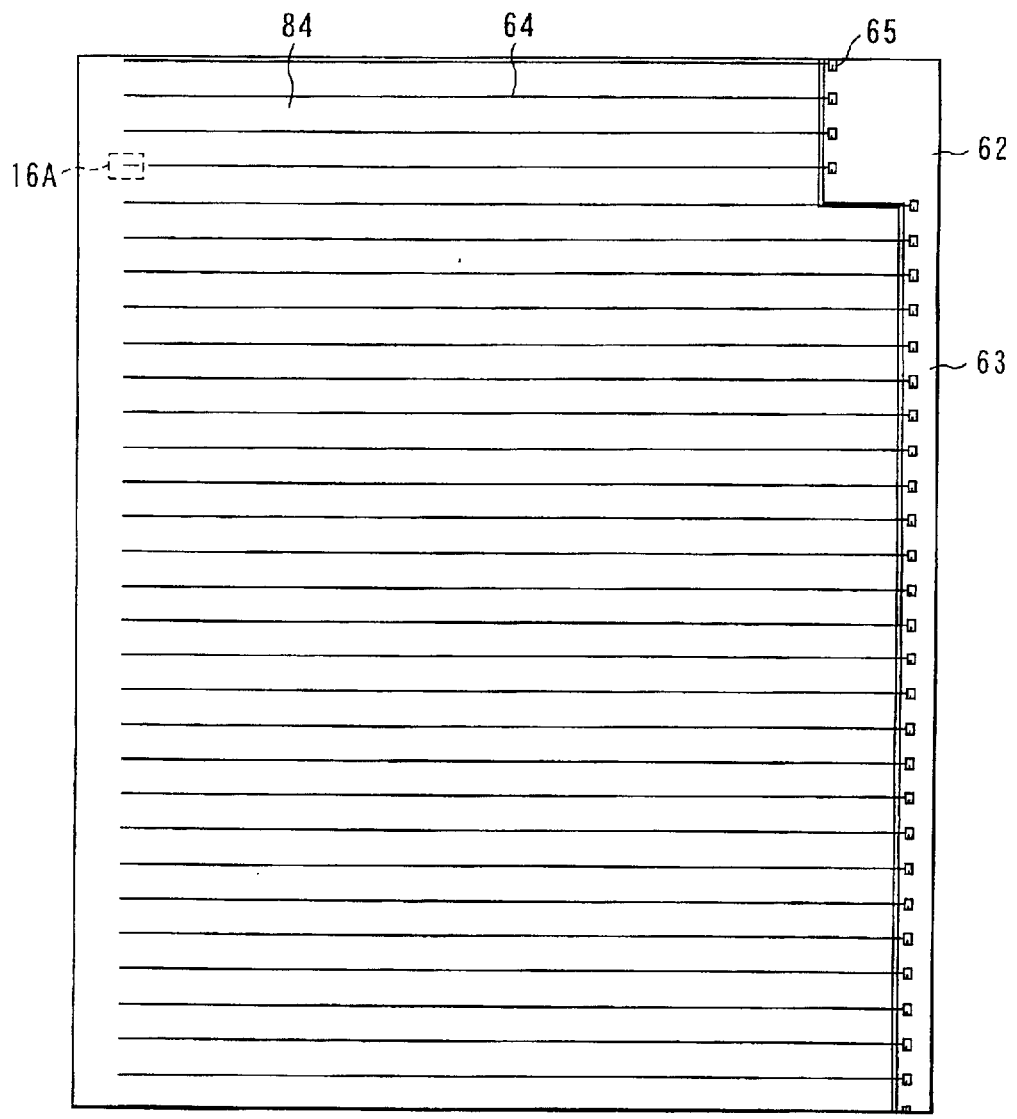
FIG. 15 is a plan view of a MOSFET chip according to a sixth embodiment of the present invention.

FIG. 15 is a plan view of a MOSFET chip according to the sixth embodiment of the present invention. FIG. 15 illustrates the MOSFET chip viewed from the top and shows only a gate electrode and a drain electrode for simplicity.

This MOSFET chip includes a bonding pad 62, a gate pattern 63, a drain electrode 84, and a gate line 64. On the MOSFET chip surface, there are formed the bonding pad 62, the gate pattern 63, and the drain electrode 84. The bonding pad 62 is used for external connection. The bonding pad 62 is continuously connected to the gate pattern 63. A plurality of the gate lines 64 is formed below the drain electrode 84 intermediated by an insulator. The end of this gate line 64 reaches the bottom of the bonding pad 62 (or the gate pattern 63). A via-hole 65 is provided above the end of the gate line 64. The gate line 64 is connected to the bonding pad 62 (or the gate pattern 63) through the via-hole 65. The gate line 64 is made of a metal material for decreasing the gate resistance.

The thick gate pattern 63 extends from the bonding pad 62 for the gate. Further, the gate line 64 is electrically connected to the bonding pad 62 or the gate pattern 63. A metal material such as aluminum is used for the bonding pad 62, the gate pattern 63, and the gate line 64.

Though not shown in FIG. 15, a gate electrode is formed so as to lie at right angles to the gate line 64. The gate line 64 and the gate electrode are electrically connected to each other (see FIG. 16A later). The gate line 64 is approximately 2 to 4 µm wide. A gap between gate lines 64 is approximately 50 to 200 µm.

Figure 16A:
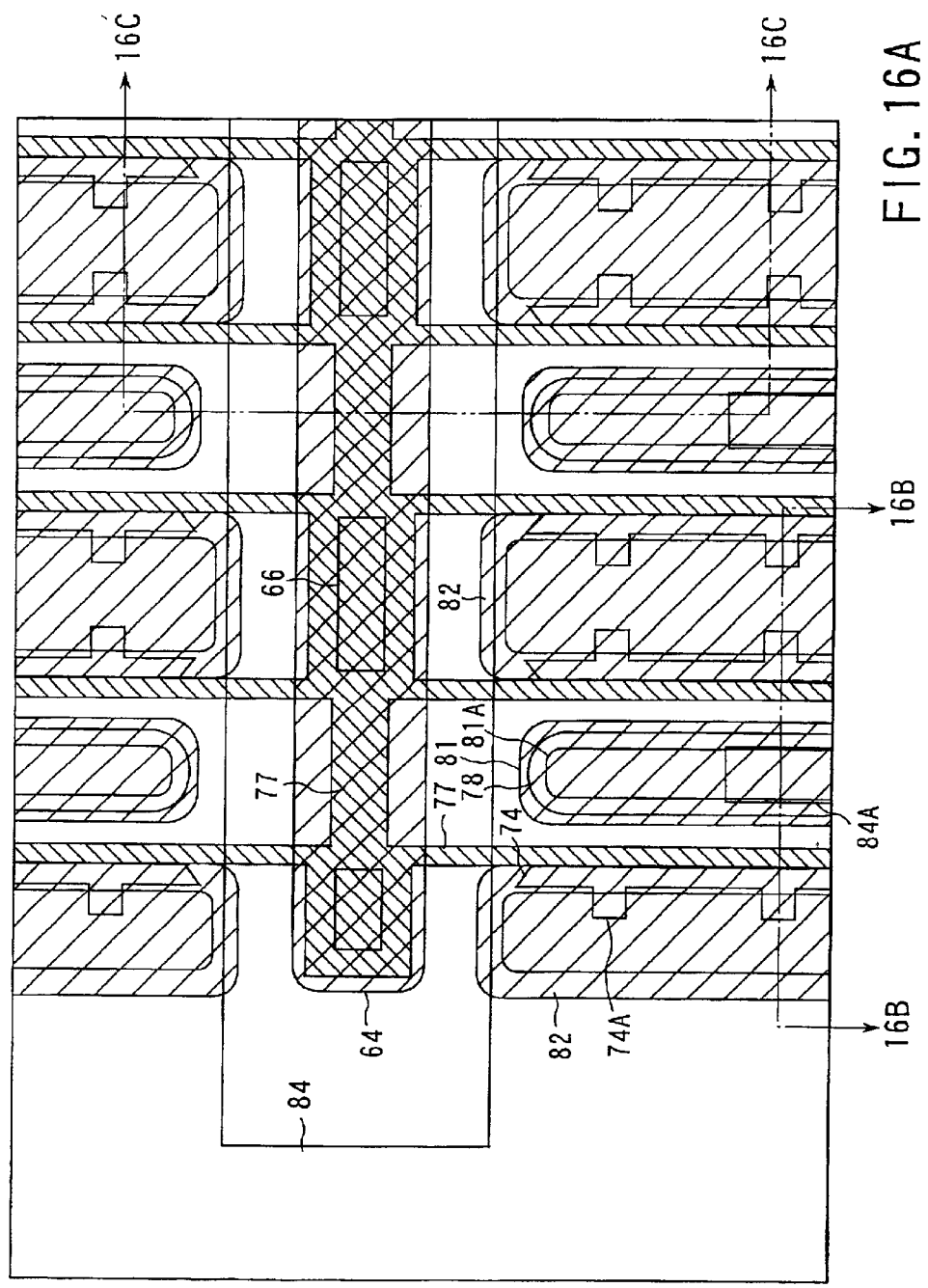
FIG. 16A is an enlarged plan view of portion 16A on the MOSFET chip according to the sixth embodiment of the present invention.
Figure 16B:
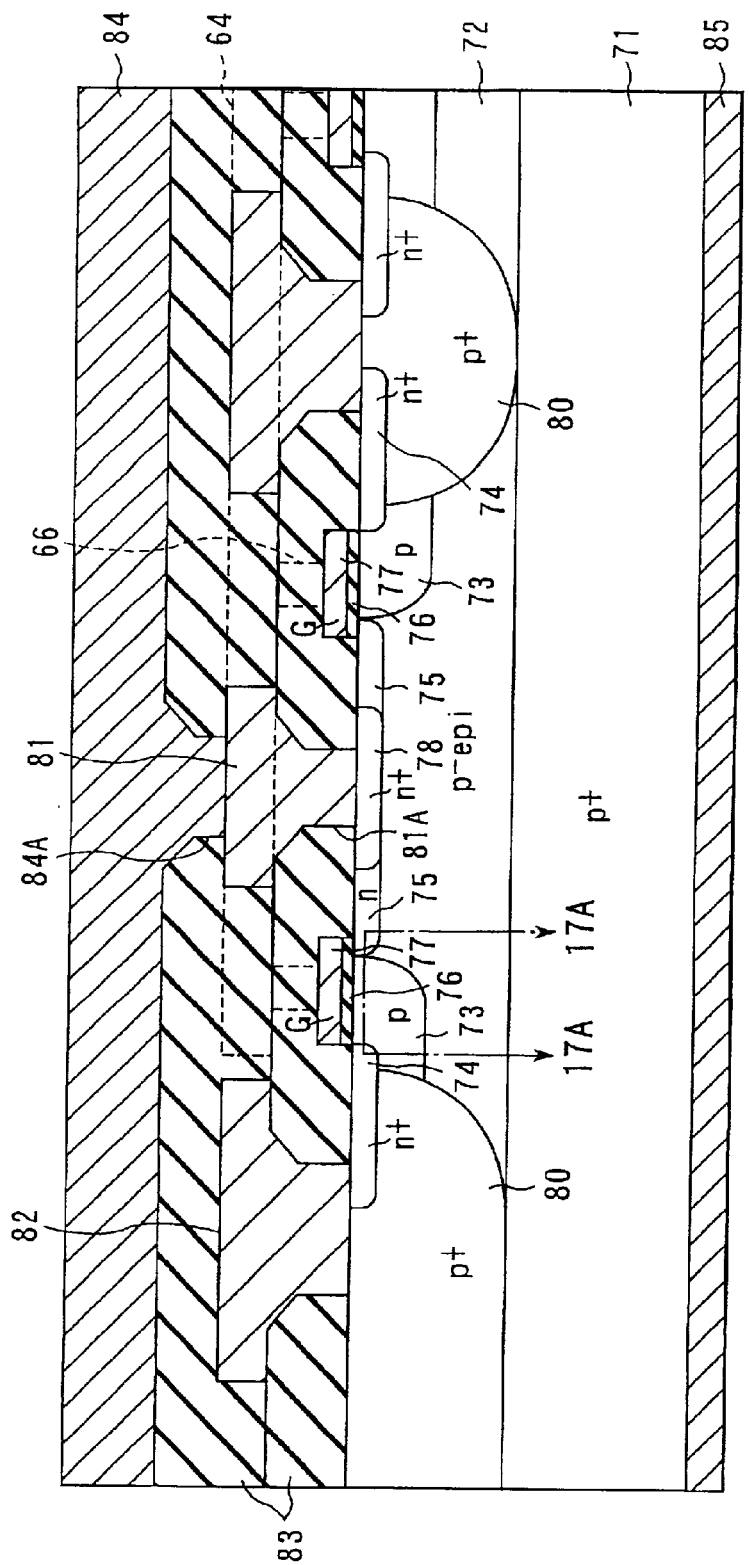
FIG. 16B is a sectional view taken along line 16B—16B in the plan view of FIG. 16A.
Figure 16C:
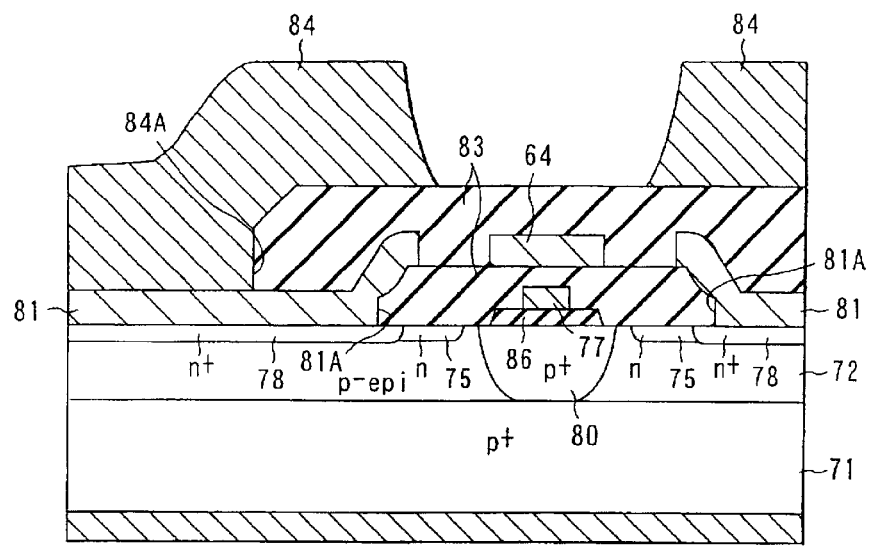
FIG. 16C is a sectional view taken along line 16C—16C in the plan view of FIG. 16A.

FIG. 16A is an enlarged plan view of portion 16A on the MOSFET chip in FIG. 15. FIG. 16B is a sectional view taken along line 16B—16B in the plan view of FIG. 16A. FIG. 16C is a sectional view taken along line 16C—16C in the plan view of FIG. 16A.

Electrodes are hatched in FIG. 16A. The gate line 64 is connected to a polysilicon gate electrode 77 via a contact hole 66. The gate electrode 77 may be formed of metal silicide.

In order to decrease parasitic capacitance between the gate and the drain, the drain electrode 84 on the gate line 64 is removed in a long and narrow rectangle along the gate line 64 (see FIG. 16C). The n+ type source region 74 is shaped like a comb. Namely, a protrusion 74A is formed in the n+ type source region 74. The ruggedness to avalanche current is improved by contacting the protrusion 74A with the short circuit electrode 82. A withstand voltage decreases when an electric field concentrates on an edge of the end of the n+ type drain region 78. To avoid this, the edge thereof is rounded.

With reference to FIG. 16B, the following describes in detail the configuration of the MOSFET formed on the above-mentioned MOSFET chip.

As shown in FIG. 16B, a p– type silicon epitaxial layer 72 approximately 3 to 4 µm thick is formed by means of epitaxial growth on one principal plane of a low-resistance p+ type silicon semiconductor substrate 71. On the surface of the p– type epitaxial layer 72, a p type body region 73 is formed.

The n+ type source region 74 and an n type drift region 75 are formed so that they face to each other by sandwiching part of the surface of the p type body region 73. A gate electrode 77 is formed on the p type body region 73 sandwiched between the n+ type source region 74 and the n type drift region 75 via a gate insulator 76 comprising a silicon oxide film. The gate electrode 77 is approximately 0.3 to 0.6 µm length. An n+ type drain region 78 is formed on the n type drift region 75.

A p+ type region 80 is formed under the n+ type source region 74. The p+ type region 80 is a deep region extending to the p+ type semiconductor substrate 71 from the surface of the p– type epitaxial layer 72. A short circuit electrode 82 is formed on the n+ type source region 74 and the p+ type region 80 for electrically connecting these regions. A contact plug 81A and a drain electrode 81 are formed on the n+ type drain region 78.

An interlayer insulator 83 is formed above the thus configured p– type epitaxial layer 72. On the interlayer insulator 83, there is formed a drain electrode 84 electrically connected to the n+ type drain region 78 via the contact plug 81A and the drain electrode 81. A source electrode 85 is formed on the other principal plane of the p+ type semiconductor substrate 71. The n+ type source region 74 is electrically connected to the source electrode 85 via the short circuit electrode 82, the p+ type region 80, and the p+ type semiconductor substrate 71.

The following describes the configuration of a section taken along line 16C—16C in the above-mentioned MOSFET chip with reference to FIG. 16C.

As mentioned above, the drain electrode 84 is provided above the gate line 64 and is slenderly removed along the gate line 64 for decreasing the parasitic capacitance between the gate and the drain. The parasitic capacitance between the gate and the source is decreased by forming an oxide film 86 under the gate electrode 77 thicker than the gate insulator 76. The oxide film 86 is approximately 100 to 300 nm thick. The p+ type region 80 is formed below the gate electrode 77. It may be preferable to omit the p+ type region 80 formed below the gate electrode 77.

In the MOSFET having the above-mentioned configuration, main electrodes include the drain electrode 84 formed on one principal plane of the p+ type semiconductor substrate 71 and the source electrode 85 formed on the other principal plane. The short circuit electrode 82 is formed for short-circuiting the n+ type source region 74 and the p+ type region 80.

The MOSFET according to this embodiment uses the p+ type region 80 to electrically connect the n+ type source region 74 and the p+ type semiconductor substrate 71. Namely, the short circuit electrode 82 short-circuits the n+ type source region 74 and the p+ type region 80. The p+ type region 80 is diffused deep in the p– type epitaxial layer 72 and reaches the p+ type semiconductor substrate 71.

The drain region comprises the n type drift region 75 as an LDD (lightly doped drain) and the n+ type drain region 78 as a contact region. When the withstand voltage of the MOSFET is approximately 30 to 40V, in FIG. 16, the n type drift region 75 is about 1 µm length. The n type drift region 75 is formed by ion-implanting n type impurities such as phosphorus (P) or arsenic (As). The amount of implanted n type impurities is approximately $2 \times 10^{12}$ to $5 \times 10^{12}$ cm$^{-2}$. During the ion-implantation, the gate electrode 77 is used as a mask. The end of the n type drift region 75 on the source side is formed by an edge of the gate electrode 77 based on self-alignment. The n type drift region 75 is shallowly formed 0.1 to 0.2 µm deep. This decreases an area in which the drain region faces the gate electrode 77, namely an area in which the n type drift region 75 overlaps with the gate electrode 77, decreasing the capacity between the drain and the gate. Accordingly, this MOSFET provides a fast switching speed and a small switching loss.

The n+ type drain region 78 needs an ohmic contact with the contact plug 81A. Accordingly, the n type impurity concentration on the surface of the n+ type drain region 78 is $1\times10^{18}$ cm$^{-3}$ or more, preferably $1\times10^{19}$ cm$^{-3}$ or more. When the MOSFET just needs a withstand voltage of approximately 10 V or less, the n type drift region 75 can be omitted. In this case, the n+ type drain region 78 is formed by using the gate electrode 77 as a mask based on self-alignment.

The interlayer insulator 83 between the short circuit electrode 82 and the drain electrode 84 has a thickness of 1 µm or more. This decreases the parasitic drain-source capacitance generated between the short circuit electrode 82 and the drain electrode 84. The thickness of the drain electrode 84 is 4 µm or more, preferably 6 µm or more. The p+ type semiconductor substrate 71 is thinned 100 µm or less in order to decrease the on-resistance.

The MOSFET channel region includes not only the p− type epitaxial layer 72 (p− type silicon layer), but also the p type body region 73. This p type body region 73 is formed by means of the ion implantation and the thermal diffusion of p type impurities such as boron (B). The ion implantation of p type impurities precedes formation of the gate electrode 77. At this time, an ion is implanted into approximately half of the bottom of the later formed gate electrode 77 on the source side. No ion is implanted into approximately the half on the drain side. Consequently, the p type impurity concentration under the gate electrode lowers near the end of the channel region on the drain side, namely a portion overlapping with the n type drift region 75 (see FIGS. 17A and 17B). This prevents the resistance from increasing at the tip of the n type drift region 75 (near the gate electrode).

Figure 17A:
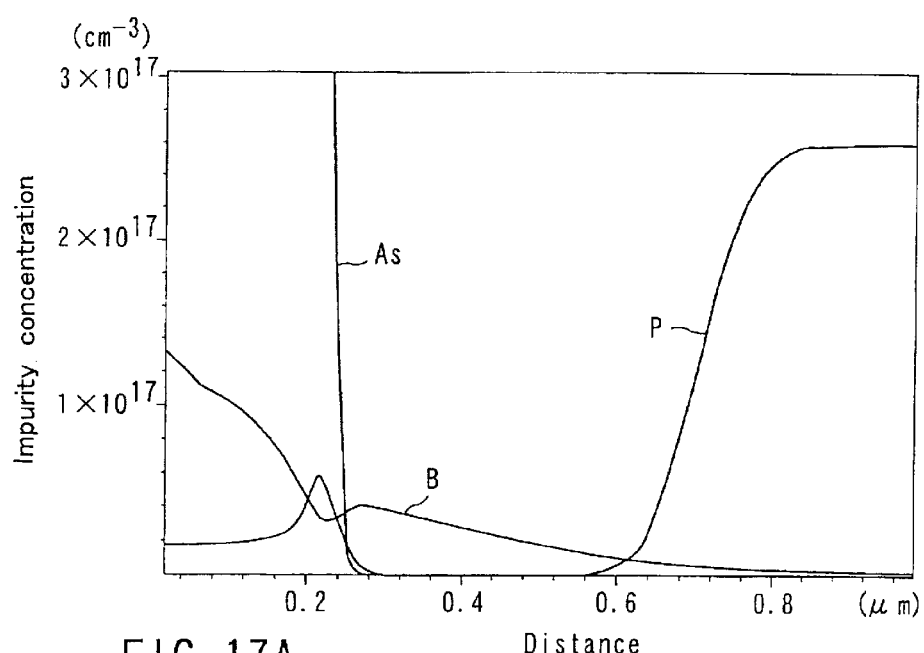
FIG. 17A is an impurity atom concentration profile for a region taken along line 17A—17A in the sectional view of FIG. 16B.
Figure 17B:
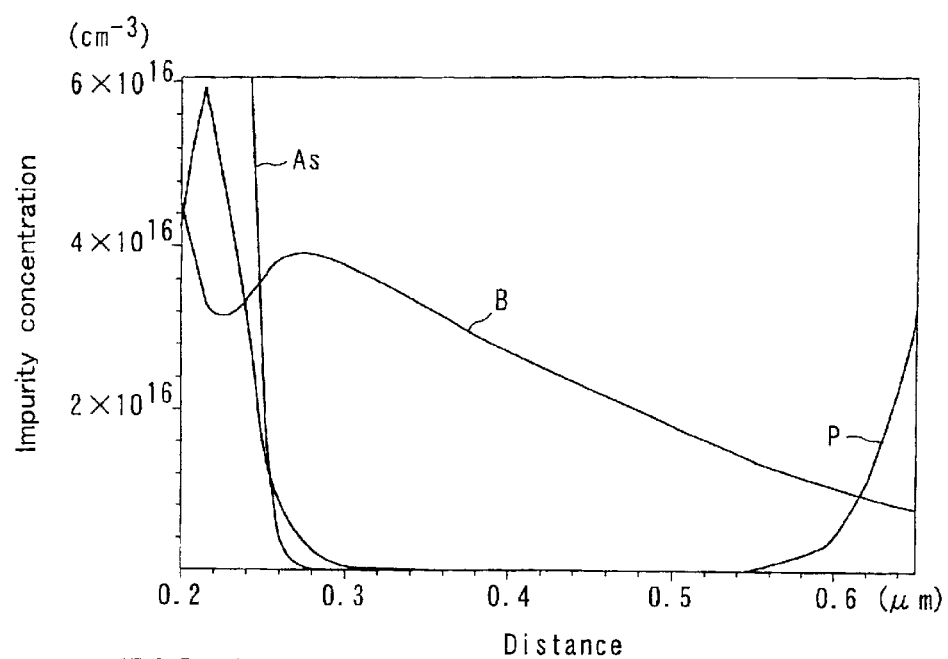
FIG. 17B is an enlarged impurity atom concentration profile for a channel region below a gate electrode according to the impurity atom concentration profile in FIG. 17A (ion-implanted up to half of a region below the gate electrode)

The following describes in detail the p type impurity concentration under the above-mentioned gate electrode with reference to FIGS. 17A and 17B. FIG. 17A is an impurity atom concentration profile for a region taken along line 17A—17A in the sectional view of FIG. 16B. FIG. 17B is an enlarged impurity atom concentration profile for a channel region below the gate electrode according to the impurity atom concentration profile in FIG. 17A. In these figures, the abscissa axis denotes a distance from the end of the gate electrode on the source side, and the ordinate axis denotes the impurity concentration.

The impurity atom concentration profiles in FIGS. 17A and 17B show that the ion implantation for forming the p type body region 73 is conducted up to half of the region below the gate electrode. For comparison with this case, FIG. 17C is an enlarged impurity atom concentration profile for the channel region below the gate electrode when the ion implantation for forming the p type body region 73 is conducted for the entire region below the gate electrode.

Figure 17C:
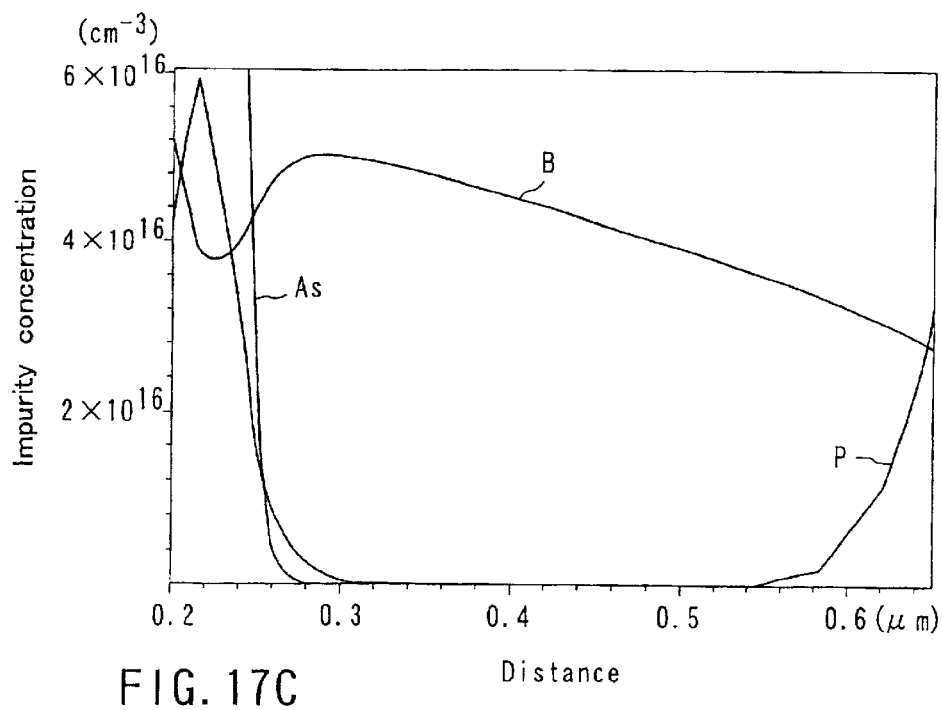
FIG. 17C is an enlarged impurity atom concentration profile for the channel region below the above-mentioned gate electrode (ion-implanting an entire region below the gate electrode)

Compared to FIG. 17C, the impurity concentration distribution in FIG. 17B shows that the boron (B) concentration decreases just under the gate electrode end on the drain side (right end in FIG. 17B). Accordingly, the resistance does not increase at the tip of the n type drift region 75.

When the ion implantation for forming the p type body region 73 is conducted for the entire region below the gate electrode as shown in FIG. 17C, the boron (B) concentration increases just under the gate electrode end on the drain side (right end in FIG. 17C). The net impurity amount decreases at the tip of the n type drift region 75. This amount is found by subtracting the boron concentration from the phosphorus concentration. As a result, the resistance of the n type drift region 75 increases, thus increasing the on-resistance of the MOSFET.

It may be preferable to make the withstand voltage between the source and the drain lower than that between the source and the drain in the section of FIG. 16B. This is achieved by shortening the distance between the p+ type region 80 and the n type drift region 75 as shown in the section of FIG. 16C. Hence, it is possible to improve the ruggedness to avalanche current.

The following describes the MOSFET as modifications of the sixth embodiment.

Figure 18:
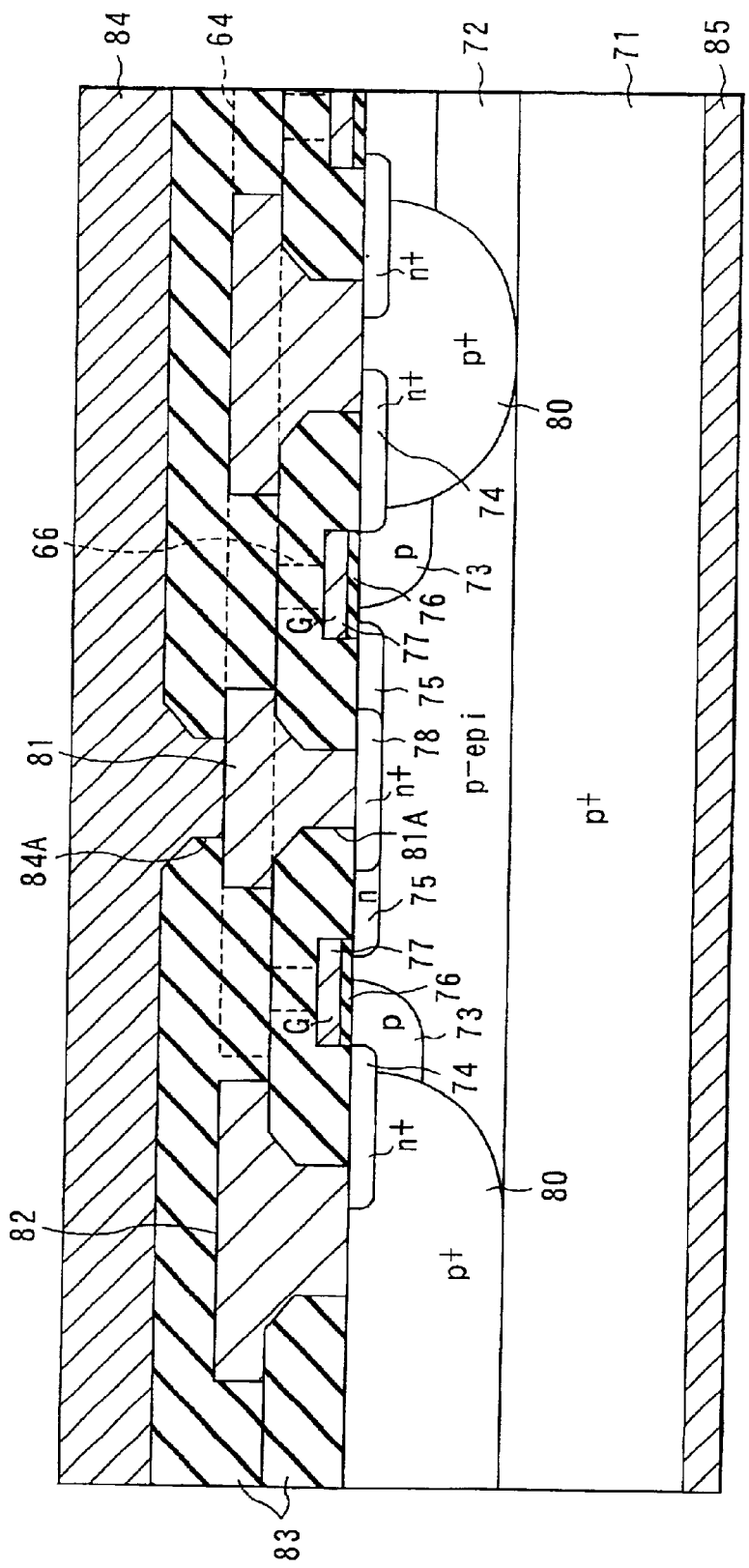
FIG. 18 is a sectional view showing a configuration of the MOSFET as a first modification according to the sixth embodiment of the present invention.

FIG. 18 is a sectional view showing a configuration of the MOSFET as a first modification according to the sixth embodiment of the present invention.

After the gate electrode 77 is formed, this MOSFET is subject to ion implantation for forming the p type body region 73 by using the gate electrode 77 as a mask. During the ion implantation process, the drain region is blocked by using a resist material, etc. The other parts of the configuration are same as those for the sixth embodiment.

In this first modification, the boron (B) concentration decreases just under the end of the gate electrode 77 on the drain side. Accordingly, the resistance does not increase at the tip of the n type drift region 75.

Figure 19:
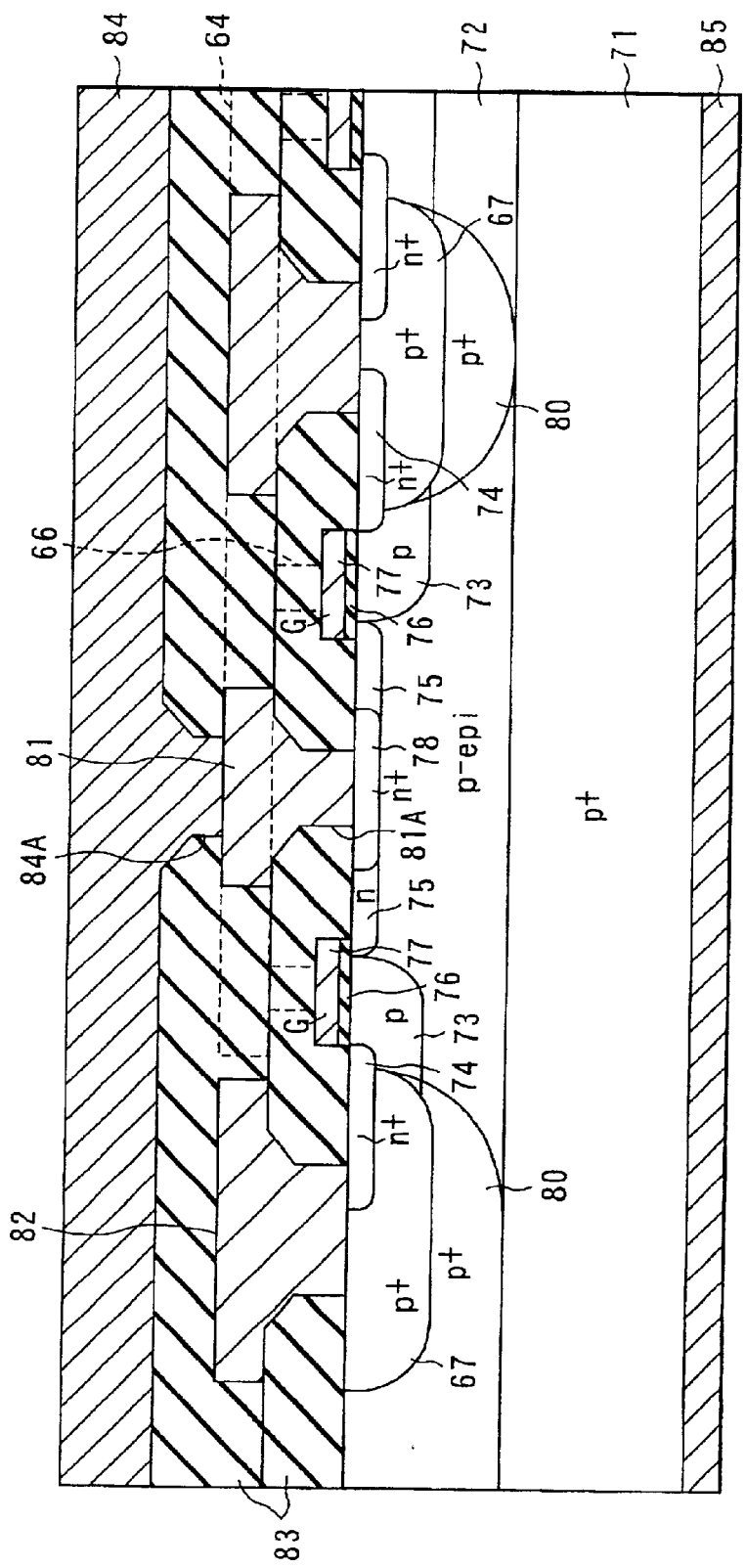
FIG. 19 is a sectional view showing a configuration of the MOSFET as a second modification according to the sixth embodiment of the present invention.

FIG. 19 is a sectional view showing a configuration of the MOSFET as a second modification according to the sixth embodiment of the present invention.

This MOSFET further forms a p+ type region 67 under the n+ type source region 74 as an addition to the configuration in FIG. 16B for preventing latchup in the n+ type source region 74 and improving the ruggedness to avalanche current. The other parts of the configuration are same as those for the sixth embodiment as shown in FIG. 16B.

This second modification provides the p+ type region 67 to decrease the resistance (resistance to a hole) in the region under the n+ type source region 74. The impurity amount for the p+ type region 67 is approximately $5\times10^{13}$ to $1\times10^{15}$ cm$^{-2}$. This decreases the voltage drop due to an avalanche current and improves the ruggedness to avalanche current.

As mentioned above, the sixth embodiment and the modifications thereof can decrease a switching loss at a high frequency and provide a MOSFET with low on-resistance. Further, it is possible to provide a MOSFET capable of improving a tolerance for avalanche breakdown.

Seventh Embodiment

Figure 20:
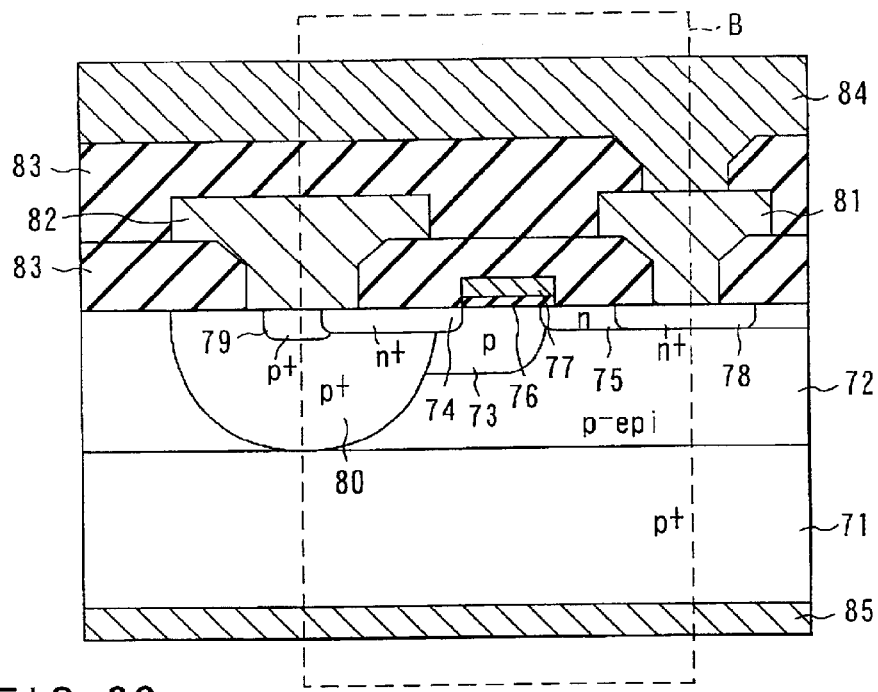
FIG. 20 is a sectional view showing a configuration of the MOSFET according to a seventh embodiment of the present invention.

FIG. 20 is a sectional view showing a configuration of the MOSFET according to a seventh embodiment of the present invention.

As shown in FIG. 20, the p− type silicon epitaxial layer 72 approximately 4 µm thick is formed by means of epitaxial growth on one principal plane of the low-resistance p+ type silicon semiconductor substrate 71. On the surface of the p− type epitaxial layer 72, the p type body region 73 is formed.

The n+ type source region 74 and the n type drift region 75 are formed so that they face to each other by sandwiching part of the surface of the p type body region 73. The gate electrode 77 is formed on the p type body region 73 sandwiched between the n+ type source region 74 and the n type drift region 75 via the gate insulator 76 comprising a silicon oxide film. The n+ type drain region 78 is formed on the n type drift region 75.

Near the n+ type source region 74, a p+ type region 79 is formed at the side end of the n+ type source region 74. Further, the p+ type region 80 is formed under the p+ type region 79. The p+ type region 80 is a deep region extending to the p+ type semiconductor substrate 71 from the surface of the p− type epitaxial layer 72.

The first-layer drain electrode 81 is formed on the n+ type drain region 78. On the n+ type source region 74 and the p+ type region 79, there is formed an electrode 82 for electrically connecting these regions. An insulation layer 83 is formed above the thus structured p– type epitaxial layer 72. On the insulation layer 83, there is formed the second-layer drain electrode 84 electrically connected to the n+ type drain region 78 via the first-layer drain electrode 81. The source electrode 85 is formed on the other principal plane of the p+ type semiconductor substrate 71. The n+ type source region 74 is electrically connected to the source electrode 85 via the electrode 82, the p+ type region 79, the p+ type region 80, and the p+ type semiconductor substrate 71. The p+ type region 79 need not necessarily be fabricated if the surface of the p+ type region 80 ensures a sufficiently high impurity concentration.

The MOSFET having the configuration as shown in FIG. 20 provides the drain electrode 84 and the source electrode 85 on both principal planes of the p+ type semiconductor substrate 71. A connection is made between the n+ type source region 74 and the p+ type semiconductor substrate 71 by using the p+ type regions 79 and 80 formed on the p– type epitaxial layer 72. This configuration can decrease the on-resistance. Compared to the case where the trench gate is used, it is possible to decrease the parasitic capacitance between the gate electrode 77 and the n+ type drain region 78 and suppress a switching loss at a high frequency from increasing. Since the n type drift region 75 is provided, a depletion layer is easily formed in the drain region. It is possible to improve a withstand voltage between the n+ type drain region 78 and the n+ type source region 74.

FIG. 20 shows a partial section of the element. Actually, in order to provide a large current, it is necessary to form a configuration by symmetrically duplicating the configuration of a portion (unit cell) indicated by a broken line B. Namely, it is necessary to form a plurality of elements in FIG. 20.

According to the seventh embodiment as mentioned above, the drain electrode and the source electrode are provided on both principal planes of the semiconductor substrate. The impurity diffusion region is used to connect the source region with the low-resistance semiconductor substrate (source electrode). Therefore, this embodiment can decrease the on-resistance. Further, it is possible to decrease the parasitic capacitance between the gate and the drain and suppress a switching loss at a high frequency from increasing. Since the drain region is provided with the drift region, it is possible to improve a withstand voltage between the drain and the source.

Figure 21:
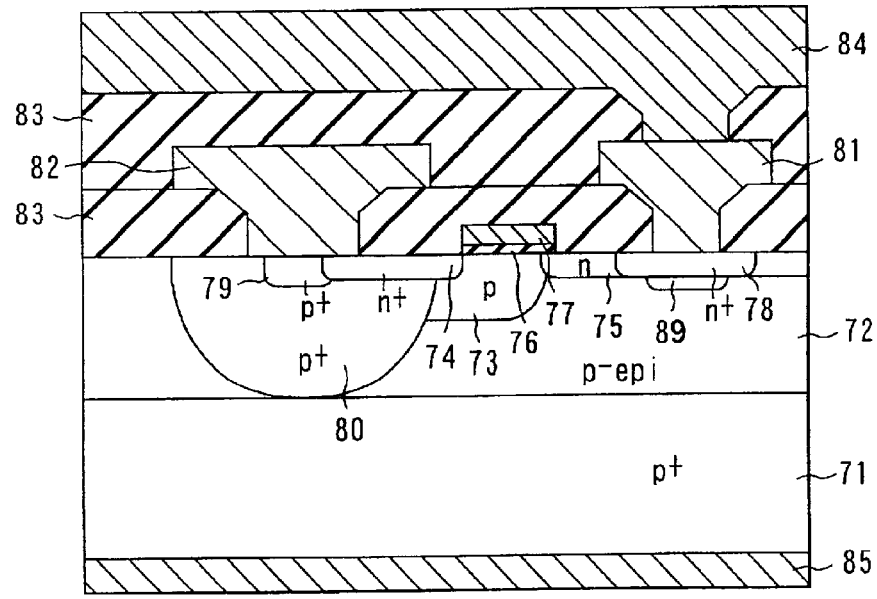
FIG. 21 is a sectional view showing a configuration of the MOSFET as a first modification according to the seventh embodiment of the present invention.

FIG. 21 is a sectional view showing a configuration of the MOSFET as a first modification according to the seventh embodiment of the present invention.

This MOSFET provides the n+ type drain region 78 according to the seventh embodiment with a deeper n+ type region.

As shown in FIG. 21, a deeper n+ type region 89 is formed in the n+ type drain region 78. This makes a distance between the n+ type region 89 and the p+ type semiconductor substrate 71 shorter than a distance between the n+ type drain region 78 and the p+ type semiconductor substrate 71 according to the seventh embodiment. The other parts of the configuration are same as those for the seventh embodiment.

The MOSFET in FIG. 21 allows a voltage generated during switching etc. to be clamped by the vertical diode comprising the n+ type region 89 and the p+ type semiconductor substrate 71, preventing a large voltage from being applied to the channel. Further, a high withstand voltage can be provided between the n+ type drain region 78 and the n+ type source region 74. Consequently, it is possible to prevent the MOSFET from being destroyed.

Figure 22:
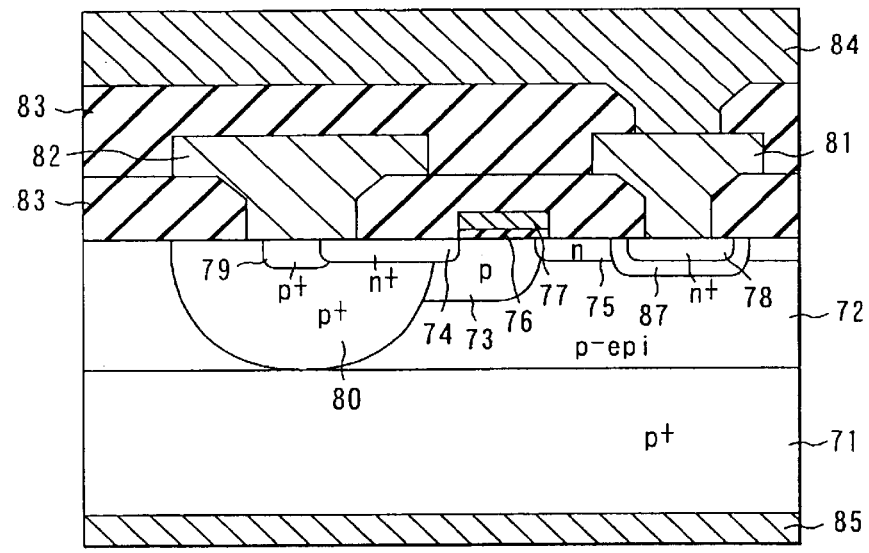
FIG. 22 is a sectional view showing a configuration of the MOSFET as a second modification according to the seventh embodiment of the present invention.

FIG. 22 is a sectional view showing a configuration of the MOSFET as a second modification according to the seventh embodiment of the present invention.

This MOSFET forms an n type region 87 outside the n+ type drain region 78 according to the seventh embodiment and configures a 2-stage RESURF layer like the modification of the third embodiment as shown in FIG. 7.

As shown in FIG. 22, the n type region 87 is formed so as to cover the n+ type drain region 78. The n type region 87 provides a higher impurity concentration than for the n type drift region 75. For example, the total dose of impurities existing in the n type drift region 75 is approximately $1 \times 10^{11}$ to $5 \times 10^{12}$ cm$^{-2}$. It is desirable to set the total dose of impurities existing in the n type region 87 to approximately $2 \times 10^{12}$ to $1 \times 10^{13}$ cm$^{-2}$. According to this setting, avalanche breakdown is allowed to occur around the n type region 87 (near the boundary between this region and the n type drift region 75) when a voltage exceeding the withstand voltage is applied. The other parts of the configuration are same as those for the seventh embodiment.

The MOSFET in FIG. 22 allows a voltage generated during switching etc. to be clamped by the diode formed between the n+ type drain region 78 and the p+ type semiconductor substrate 71, preventing a large voltage from being applied to the channel. Further, a high withstand voltage can be provided between the n+ type drain region 78 and the n+ type source region 74. Consequently, it is possible to prevent the MOSFET from being destroyed. It may be preferable to deepen the n+ type drain region 78 in FIG. 22 by combining the second and third modifications of the seventh embodiment.

Figure 23:
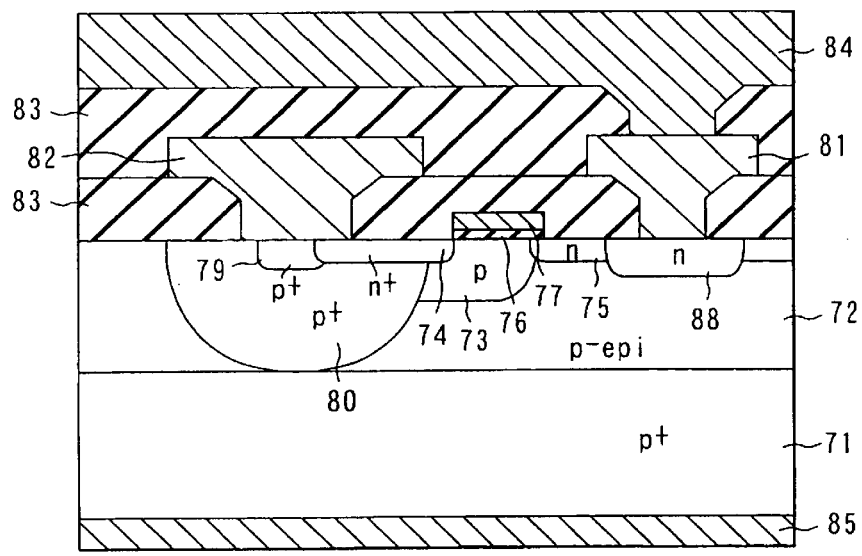
FIG. 23 is a sectional view showing a configuration of the MOSFET as a third modification according to the seventh embodiment of the present invention.

FIG. 23 is a sectional view showing a configuration of the MOSFET as a third modification according to the seventh embodiment of the present invention.

This MOSFET makes the n+ type drain region 78 deeper than the n type drift region 75 as a modification to the seventh embodiment.

As shown in FIG. 23, an n type region 88 is formed instead of the n+ type drain region 78. It may be preferable to form the n type region 88 in addition to the n-+type drain region 78. The n type region 88 should be deeper than the n type drift region 75. As a result, a distance between the n type region 88 and the p+ type semiconductor substrate 71 becomes shorter than a distance between the n+ type drain region 78 and the p+ type semiconductor substrate 71 according to the seventh embodiment. The other parts of the configuration are same as those for the seventh embodiment.

The MOSFET in FIG. 23 allows a voltage generated during switching etc. to be clamped by the vertical diode comprising the n type region 88 and the p+ type semiconductor substrate 71, preventing a large voltage from being applied to the channel. Further, a high withstand voltage can be provided between the n type region 88 as a drain region and the n+ type source region 74. Consequently, it is possible to prevent the MOSFET from being destroyed.

Like the seventh embodiment, the first to third modifications thereof need to form a configuration by symmetrically duplicating the configuration of a main portion (unit cell) in the figures for providing a large current.

Eighth Embodiment

Figure 24:
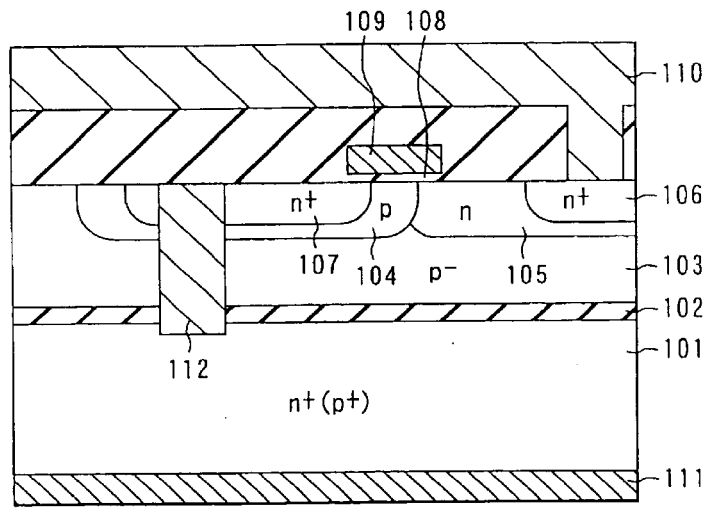
FIG. 24 is a sectional view showing a configuration of the MOSFET according to an eighth embodiment of the present invention.

FIG. 24 is a sectional view showing a configuration of the MOSFET according to an eighth embodiment of the present invention. This figure illustrates an n-channel transistor.

As shown in FIG. 24, a silicon oxide film 102 as an insulator is formed on one principal plane of an n+ type silicon semiconductor substrate 101. On the silicon oxide film 102, a p− type silicon layer 103 is formed. A planar MOSFET is formed on the surface of the p− type silicon layer 103. This MOSFET comprises an n+ type source region 107, an n+ type drain region 106, a p type body region 104, an n type drift region 105, and a gate electrode 109. The silicon oxide film 102 is 100 to 200 nm thick. The p− type silicon layer 103 is approximately 1 to 1.5 μm thick.

In the n+ type source region 107, a buried electrode 112 is formed from its surface to the n+ type semiconductor substrate 101 by piercing through the p-type silicon layer 103 and the silicon oxide film 102. On the p type body region 104, the gate insulator 109 is formed via the gate insulator 108. The n+ type drain region 106 is connected to the drain electrode 110. A source electrode 111 is formed on the other principal plane opposite the aforementioned principal plane of the n+ type semiconductor substrate 101.

Figure 25:
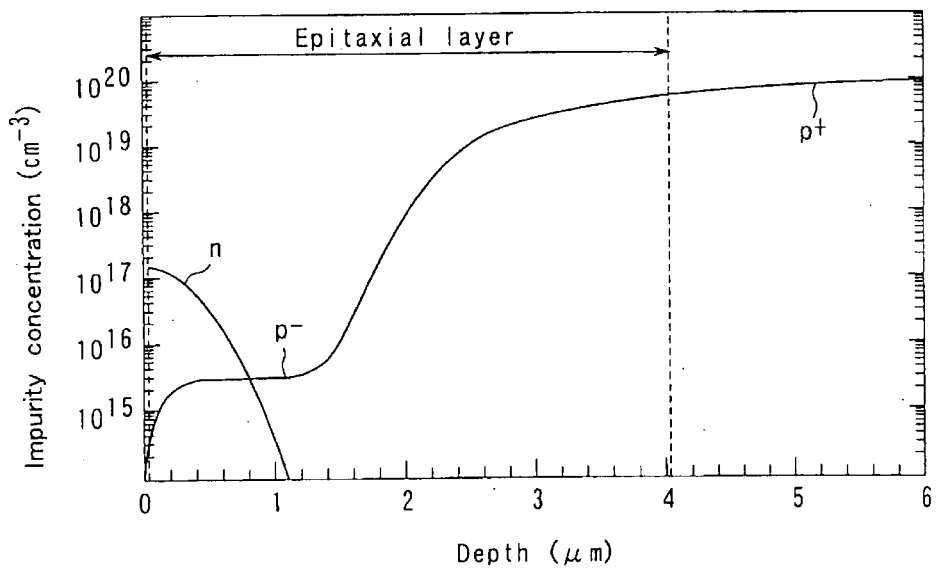
FIG. 25 shows an impurity atom concentration profile for a p− type epitaxial layer in the depth direction when the epitaxial layer is grown on a p+ type silicon substrate.

In the thus configured MOSFET, the silicon oxide film 102 separates the p− type silicon layer 103 from the n+ type semiconductor substrate 101. During a heat treatment process, the MOSFET suppresses diffusion of impurities from the n+ type semiconductor substrate 101 to the p− type silicon layer 103. Accordingly, it is possible to maintain the MOSFET withstand voltage even when the thickness of the p− type silicon layer 103 is set to as thin as approximately 1.5 μm. Suppose that the silicon oxide film 102 is unavailable and the p+ type semiconductor substrate contacts with the p− type silicon layer 103. As seen from the graph in FIG. 25, the p− type silicon layer (epitaxial layer) needs to be formed approximately 4 μm thick for ensuring a p− type layer as thick as 1.5 μm.

Since this embodiment uses the thin p− type silicon layer 103, the buried electrode 112 can be easily formed with low electric resistance. The buried electrode 112 is connected to the n+ type semiconductor substrate 101 with high impurity concentration, maintaining low contact resistance for a source extraction section from the n+ type source region 107 to the source electrode 111.

The following describes a method of fabricating the MOSFET according to the eighth embodiment. There is prepared the n+ type silicon semiconductor substrate 101 having at least one principal plane mirror-polished as a mirror surface. Likewise, there is prepared the p− type silicon semiconductor substrate having at least one principal plane mirror-polished as a mirror surface. Either or both of these semiconductor substrates are oxidized on their surfaces.

Thereafter, the mirror surfaces of these semiconductor substrates are bonded to each other. A p− type silicon substrate is ground and polished from the rear to form the p− type silicon layer 103 with a specified thickness. Instead of grinding the p− type silicon substrate from the rear, there is a method of peeling the p− type silicon substrate by leaving the p− type silicon layer 103 with a specified thickness. As a well-known method of peeling the p− type silicon substrate, a hydrogen ion implantation layer or a porous silicon layer is previously formed to a specified depth of the p− type silicon substrate. After bonding, an external pressure or heat is applied to separate the p− type silicon substrate from the hydrogen ion implantation layer or the porous silicon layer. After separation, etching or the like is conducted to flatten the surface of the p− type silicon layer.

Alternatively, it may be preferable to prepare an SOI substrate with a thin SOI (silicon on insulator) and form the p− type silicon layer 103 with a specified thickness on the SOI layer according to the epitaxial growth.

The buried electrode 112 is formed according to the following method. After a well-known method is used to form the diffusion regions 104 to 107, and the gate electrode 109 on the surface, a silicon oxide film used as a mask material for RIE (reactive ion etching) 11 is formed. This silicon oxide film should be thicker than the silicon oxide film 102, for example, to the thickness of 1 μm.

Then, etching is performed to open a part of the silicon oxide film (mask material) where the buried electrode 112 is to be formed. Using this silicon oxide film as a mask, RIE is performed for the silicon layer 103 to form a trench reaching the silicon oxide film 102. Then, RIE is performed for the silicon oxide film 102 to etch the silicon oxide film 102 and form a trench reaching the n+ type silicon substrate 101. During the RIE for the silicon oxide film 102, the silicon oxide film (mask material) is also etched and thinned. Then, this silicon oxide film (mask material) is etched and removed. Further, metal such as tungsten is deposited and buried. Superfluous metal is etched back from the surface. Finally, the buried electrode 112 is formed.

While the eighth embodiment uses n+ type silicon semiconductor substrate 101, it may be preferable to use a p+ type silicon semiconductor substrate.

Figure 26:
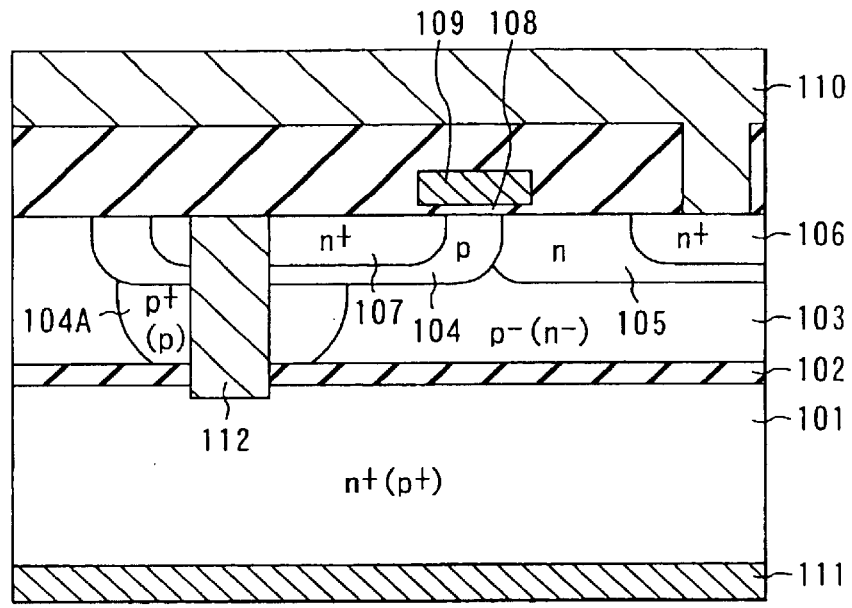
FIG. 26 is a sectional view showing a configuration of the MOSFET as a modification according to the eighth embodiment of the present invention.

FIG. 26 is a sectional view showing a configuration of the MOSFET as a modification according to the eighth embodiment of the present invention.

This MOSFET provides a p+ type or p type diffusion region 104A around the buried electrode 112. The p type diffusion region 104A decreases the resistance of the p type body region 104, and therefore improves ruggedness to avalanche current for elements. When the silicon layer (semiconductor layer) 103 is of the p− type, the diffusion region 104A may not contact with the silicon oxide film (insulator layer) 102. However, when the silicon layer (semiconductor layer) 103 is of the n− type, the diffusion region 104A needs to contact with the insulator layer 102. In this case, the diffusion region 104A separates the semiconductor layer 103 and the buried electrode 112.

Ninth Embodiment

Figure 27:
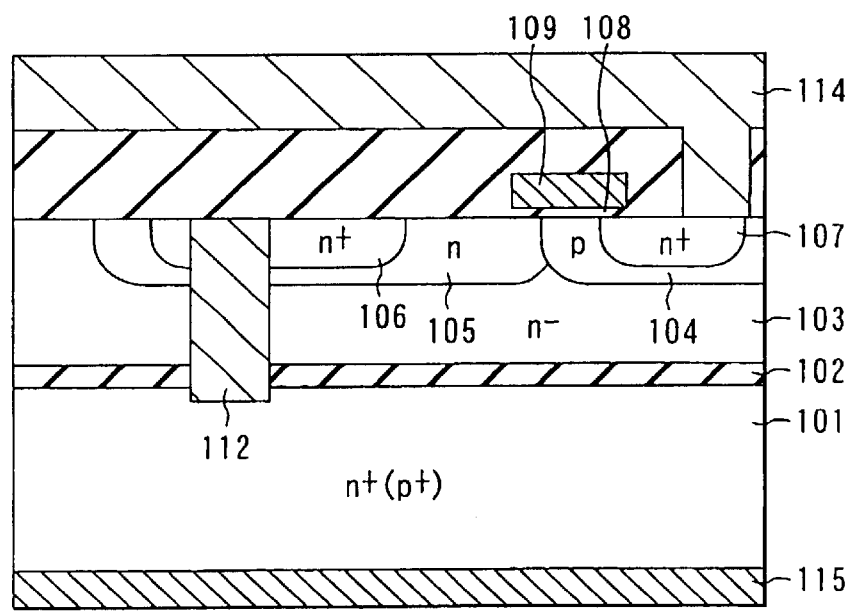
FIG. 27 is a sectional view showing a configuration of the MOSFET according to a ninth embodiment of the present invention.

FIG. 27 is a sectional view showing a configuration of the MOSFET according to a ninth embodiment of the present invention. This figure illustrates an n-channel transistor.

The ninth embodiment replaces the source with the drain in the eighth embodiment. This MOSFET forms the n− type silicon layer 103 on the silicon oxide film 102 on one principal plane of the n+ type semiconductor substrate 101. The planar MOSFET is formed on the surface of the n− type silicon layer 103. Above the n-type silicon layer 103, a source electrode 114 is formed and contacts with both the n+ type source region 107 and the p type body region 104. A drain electrode 115 is formed on the other principal plane of the n+ type semiconductor substrate 101. The buried electrode 112 is formed up to the n+ type semiconductor substrate 101 by piercing through the n+ type drain region 106, the n type drift region 105, the n− type silicon layer 103, and the silicon oxide film 102. The buried electrode 112 electrically connects the n+ type drain region 106 and the n+ type silicon substrate 101.

In order to obtain a withstand voltage, this structure requests that the n− type silicon layer 103 be not too thin under the p type body region 104. However, the silicon oxide film 102 prevents impurity diffusion to the n− type silicon layer 103 from the n+ type silicon substrate 101. Accordingly, it is possible to thin the n− type silicon layer 103 and provide the same effects as for the eighth embodiment. While the ninth embodiment uses the n+ type silicon semiconductor substrate 101, it may be preferable to use a p+ type silicon semiconductor substrate.

Figure 28:
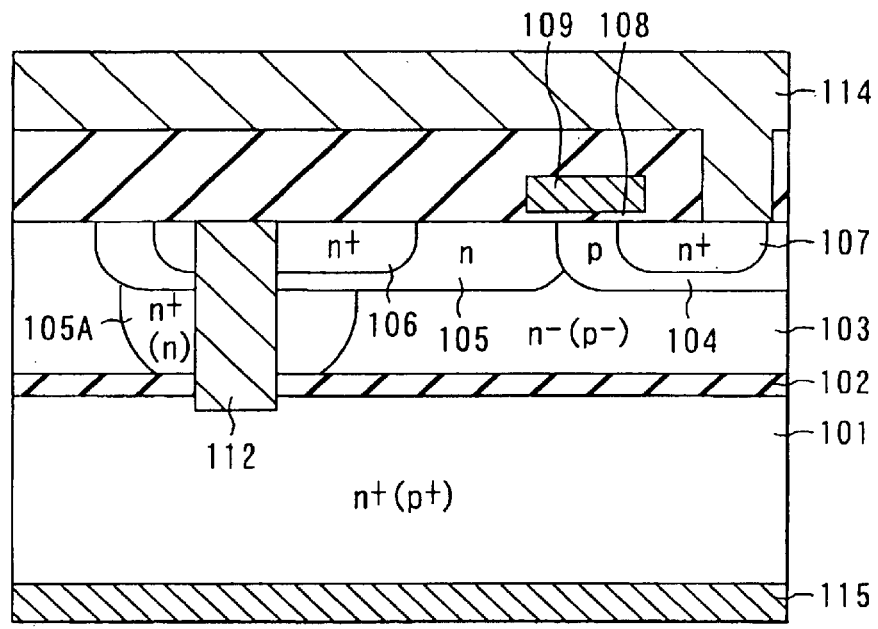
FIG. 28 is a sectional view showing a configuration of the MOSFET as a modification according to the ninth embodiment of the present invention.

FIG. 28 is a sectional view showing a configuration of the MOSFET as a modification according to the ninth embodiment of the present invention. This MOSFET provides an n+ type or n type diffusion region 105A around the buried electrode 112. The n type diffusion region 105A decreases contact resistance of the buried electrode 112. When the silicon layer (semiconductor layer) 103 is of the p– type, the n type diffusion region 105A separates the buried electrode 112 and the semiconductor layer 103.

The eighth and ninth embodiments use the buried electrode to connect the source region or the drain region with the semiconductor substrate. The same effect can be obtained by connecting an impurity diffusion region from the source region or the drain region with an impurity diffusion region from the semiconductor substrate. The following describes such an embodiment.

Tenth Embodiment

Figure 29:
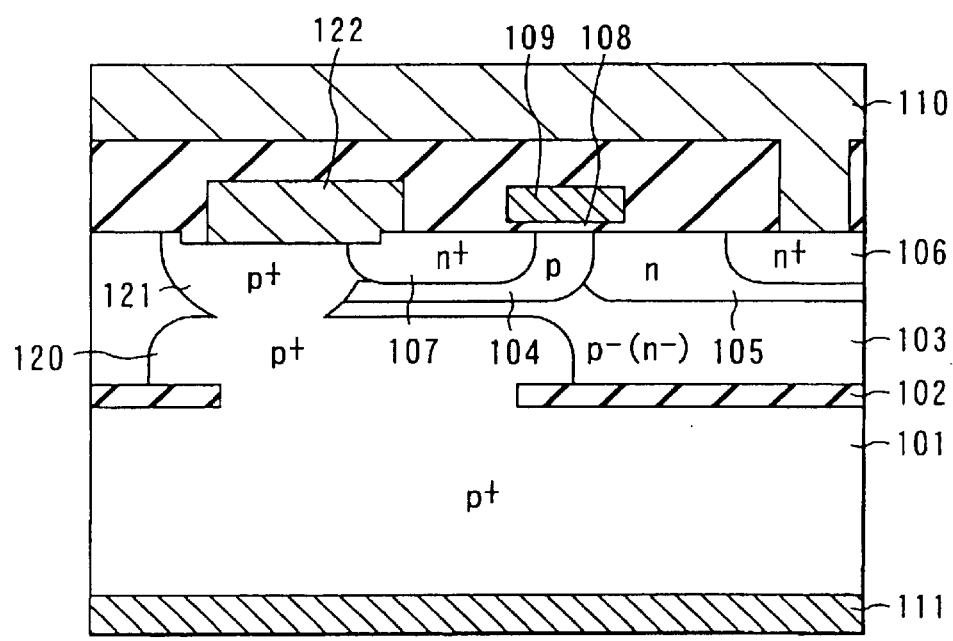
FIG. 29 is a sectional view showing a configuration of the MGSFET according to a tenth embodiment of the present invention.

FIG. 29 is a sectional view showing a configuration of the MOSFET according to a tenth embodiment of the present invention. This figure illustrates an n-channel transistor.

As shown in FIG. 29, a p+ type diffusion region 121 is formed from the surface of the semiconductor layer 103 to a given depth in the silicon layer 103 adjacent to the n+ type source region 107. Under the p+ type diffusion region 121, there is arranged a p+ type diffusion region 120 which is formed by diffusing p+ type impurities from an aperture of the silicon oxide film (insulator layer) 102. The p+ type diffusion region 121 and the p+ type diffusion region 120 are electrically connected to form a low-resistance conductive path.

The n+ type source region 107 is electrically connected to the p+ type diffusion region 121 via an internal electrode 122. The n+ type source region 107 is also electrically connected to the body region 104 via the internal electrode 122 and the p+ type diffusion region 121.

The p+ type diffusion region 121 and the p+ type diffusion region 120 form the conductive path. This path is formed by connecting diffusion regions 121 and 120 respectively diffused from the top and bottom surfaces of the semiconductor layer 103. Further, the semiconductor layer 103 can be thinned by providing the insulator layer 102. It is possible to decrease the spread of the diffusion regions 121 and 120 compared to the case where the insulator layer 102 is not provided.

Figure 30A:
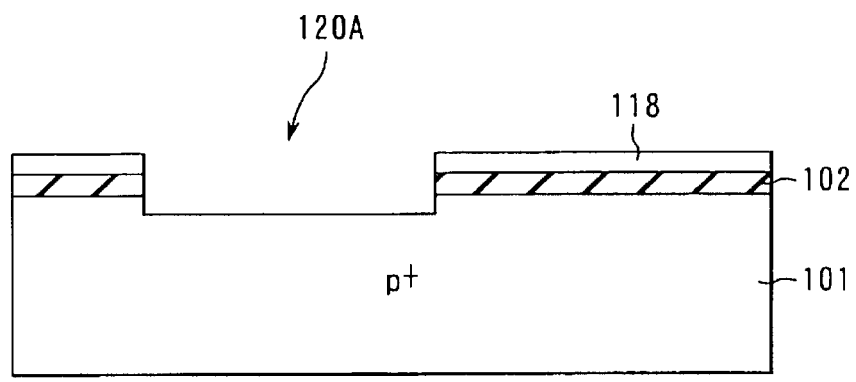
FIGS. 30A and 30B are sectional views showing a method of forming a p+ type diffusion region 120 in the MOSFET according to the tenth embodiment.

The p+ type diffusion region 120 is formed as follows. First, as shown in FIG. 30A, an SOI substrate having a thin silicon layer 118 is prepared on the p+ type semiconductor substrate 101 intermediated by the silicon oxide film 102. Then, an aperture 120A is formed by etching the silicon layer 118 and the silicon oxide film 102 corresponding to the p+ type diffusion region 120 on the SOI substrate.

Figure 30B:
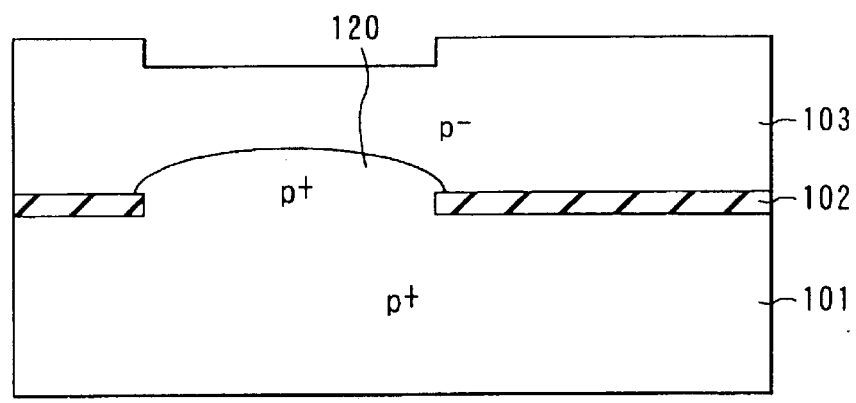

With this state, the epitaxial growth is performed to form the p– type silicon layer 103. As shown in FIG. 30B, the p+ type diffusion region 120 is formed at the aperture of the silicon oxide film 102 due to diffusion of p type impurities from the p+ semiconductor substrate 101.

After that, there is formed a MOSFET comprising the semiconductor layer 103 which includes the p+ type diffusion region 121, the p type body region 104, the n type drift region 105, the n+ type source region 107, and the n+ type drain region 106. In this manner, the MOSFET shown in FIG. 29 is formed.

The ruggedness to avalanche current can be improved during switching by forming the p+ type diffusion region 120 just under the p type body region 104 as shown in FIG. 29. When a voltage exceeding the element withstand voltage is applied during a turn-off sequence, avalanche breakdown occurs at a pn junction between the p type body region 104 and the n type drift region 105. As a result, a voltage drop is caused by a hole current applied to the source in the p type body region 104. This voltage drop allows a forward bias equivalent to a built-in voltage to be applied to a pn junction between the p type body region 104 and the n+ type source region 107. In this case, an electron flows from the n+ type source region 107, causing a latch-up condition. As a result, the turn-off sequence is disabled, destroying the MOSFET.

In this tenth embodiment, the p+ type diffusion region 120 is provided under the p type body region 104. This decreases resistance to a hole current and suppresses a large voltage drop from occurring in the body region 104. Consequently, this improves the ruggedness to avalanche current for the MOSFET.

Figure 31:
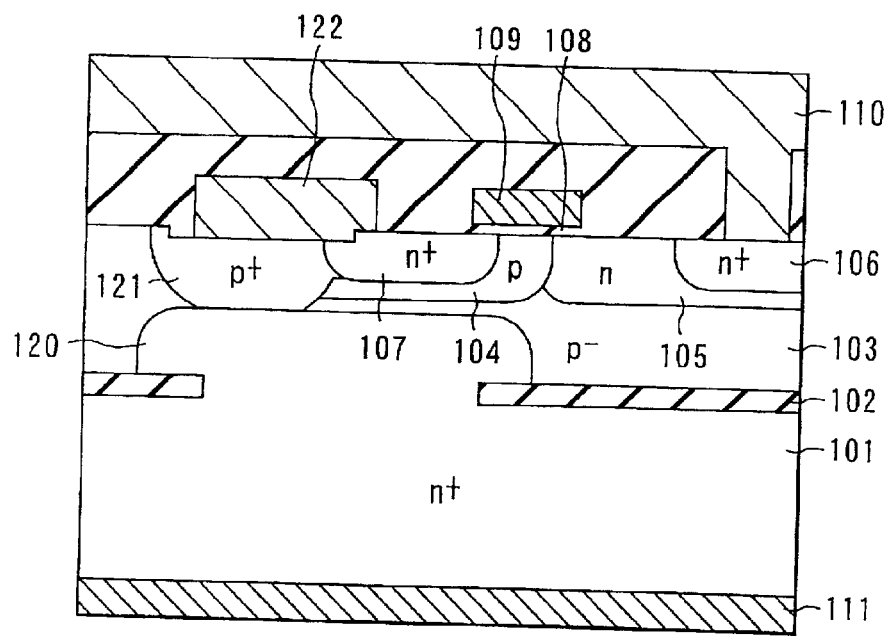
FIG. 31 is a sectional view showing a configuration of the MOSFET as a modification according to the tenth embodiment of the present invention.

The configuration in FIG. 29 can also use an n-type layer for the semiconductor layer 103. Especially in this case, it is desirable to connect the p type body region 104 with the p+ type diffusion region 120. As shown in FIG. 31, the p+ type silicon semiconductor substrate 101 can be an n+ type silicon semiconductor substrate. Though an on-resistance slightly increases in this case, the MOSFET is miniaturized.

Eleventh Embodiment

Figure 32:
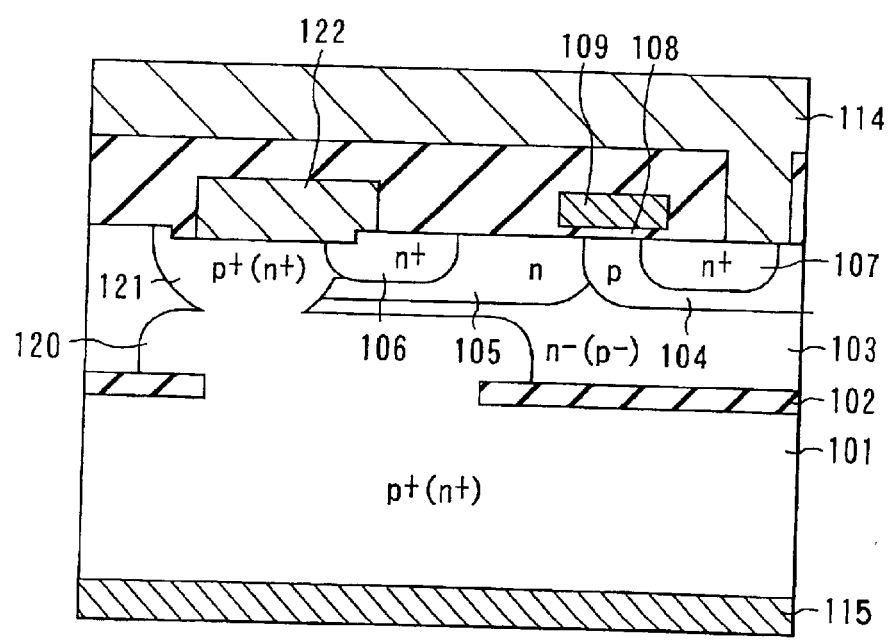
FIG. 32 is a sectional view showing a configuration of the MOSFET according to an eleventh embodiment of the present invention.

FIG. 32 is a sectional view showing a configuration of the MOSFET according to an eleventh embodiment of the present invention. This figure illustrates an n-channel transistor.

The eleventh embodiment replaces the source with the drain in the tenth embodiment. When the silicon semiconductor substrate 101 and the diffusion regions 120 and 121 are of the n type, the silicon layer 103 may be of the n– type or the p– type. When the diffusion regions 120 and 121 are of the p+ type, the silicon layer 103 needs to be of the n– type. However, the silicon layer 103 can be of the p– type by placing an n type layer between the diffusion regions 120 and 121. When the diffusion region 121 is of the n+ type, the internal electrode 122 is omissible. It may be preferable to unite the n+ type diffusion region 121 and the n+ type drain region 106.

Like the tenth embodiment, the eleventh embodiment also provides the effects of miniaturizing the MOSFET and decreasing an on-resistance, but not improving the ruggedness to avalanche current.

Effects of the present invention also can be obtained by combining the buried electrode and the impurity diffusion region as mentioned above. The following describes an embodiment for combining these.

Twelfth Embodiment

Figure 33:
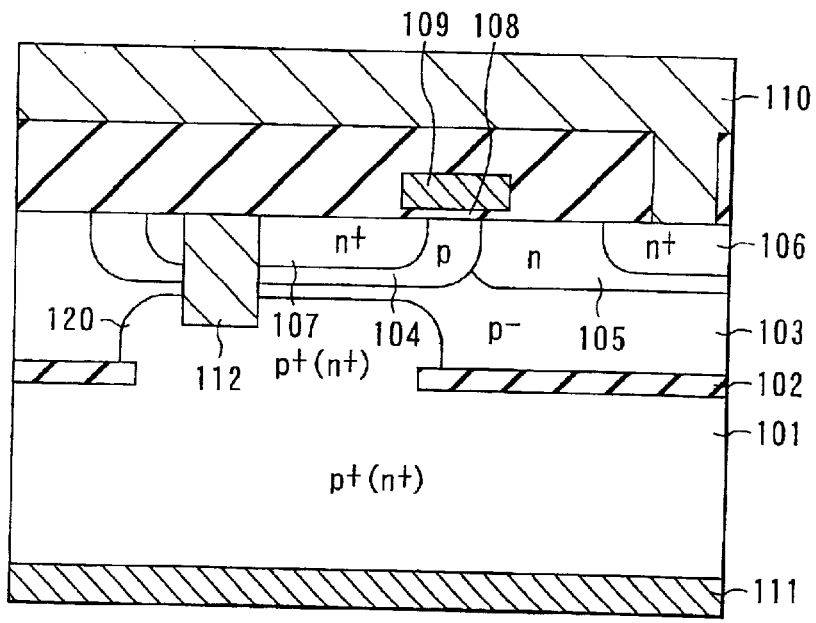
FIG. 33 is a sectional view showing a configuration of the MOSFET according to a twelfth embodiment of the present invention.

FIG. 33 is a sectional view showing a configuration of the MOSFET according to a twelfth embodiment of the present invention. This figure illustrates an n-channel transistor.

The twelfth embodiment is an example of providing the buried electrode 112 instead of forming p+ type diffusion region 121 in the tenth embodiment shown in FIG. 29. Also in this configuration, the p+ type diffusion region 120 decreases resistance to a positive hole, improving the ruggedness to avalanche current. The p+ type silicon semiconductor substrate 101 can be an n+ type silicon semiconductor substrate.

Thirteenth Embodiment

Figure 34:
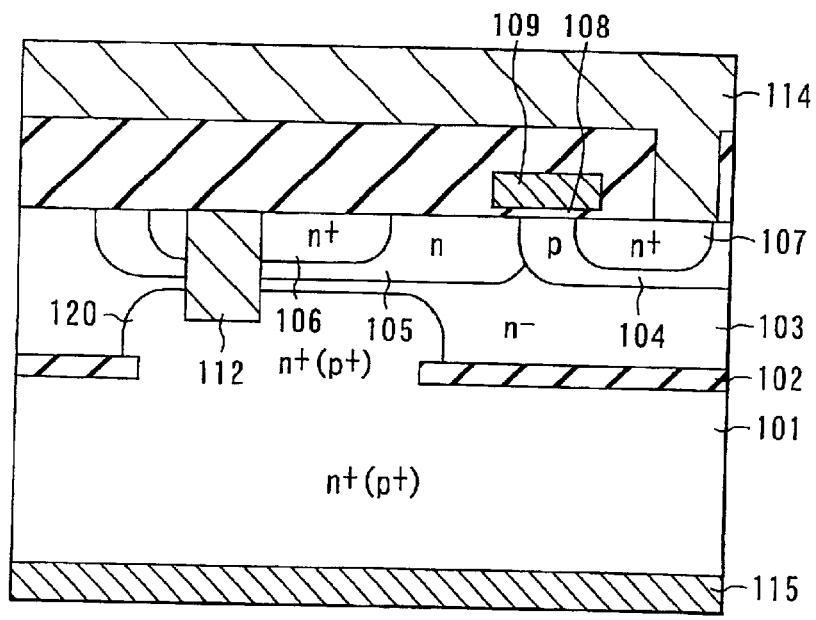
FIG. 34 is a sectional view showing a configuration of the MOSFET according to a thirteenth embodiment of the present invention.

FIG. 34 is a sectional view showing a configuration of the MOSFET according to a thirteenth embodiment of the present invention. This figure illustrates an n-channel transistor.

The thirteenth embodiment replaces the source with the drain in the twelfth embodiment. For example, the semiconductor layer 103 can be a p– type layer by connecting the n type drift region 105 with the n+ type diffusion region 120 and surrounding the buried electrode 112 with an n type layer. The n+ type silicon semiconductor substrate 101 can be a p+ type silicon semiconductor substrate.

Like the twelfth embodiment, the thirteenth embodiment also provides the effects of miniaturizing the MOSFET and decreasing an on-resistance, but not improving the ruggedness to avalanche current.

Like the seventh embodiment, the eighth to thirteenth embodiments need to form a configuration by symmetrically duplicating the configuration of a main portion (unit cell) in the figures for providing a large current.

While the above-mentioned eighth to thirteenth embodiments have described examples applied to the n-channel MOSFET, it is to be distinctly understood that the embodiments are applicable to a p-channel MOSFET by changing the n type to the p type, and vice versa. Since the SOI substrate is used, it is possible to configure a power IC chip including a power MOSFET by fabricating an integrated circuit in the semiconductor layer 103.

According to the eighth to thirteenth embodiments of the present invention as mentioned above, it is possible to provide a power MOSFET with small on-resistance by maintaining a small element area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS field effect transistor wherein a current path extends from a first principal plane of a semiconductor substrate to a second principal plane opposite to the first principal plane, said MOS field effect transistor comprising:

a semiconductor substrate of first conductive type having a first principal plane and a second principal plane opposite to said first principal plane;

a first semiconductor region of said first conductive type formed on said first principal plane of said semiconductor substrate;

a second semiconductor region of said first conductive type formed in said first semiconductor region;

a third semiconductor region of second conductive type formed in said second semiconductor region;

a fourth semiconductor region of said second conductive type formed in said first semiconductor region opposite to said third semiconductor region by sandwiching part of said second semiconductor region;

a fifth semiconductor region of said second conductive type formed in said first semiconductor region sandwiched between said fourth semiconductor region and said second semiconductor region, said fifth semiconductor region being shallower than said fourth semiconductor region;

a gate electrode formed, via a gate insulator, on said second semiconductor region sandwiched between said third semiconductor region and said fifth semiconductor region;

a first main electrode connected to said fourth semiconductor region;

a second main electrode formed on said second principal plane of said semiconductor substrate;

a sixth semiconductor region of said first conductive type extending to said semiconductor substrate from the surface of said first semiconductor region near said third semiconductor region; and a short circuit electrode formed on said third semiconductor region and on said sixth semiconductor region, wherein said first main electrode is formed on said gate electrode and on said short circuit electrode with an insulator interposed between said first main electrode and said gate electrode, and also interposed between said first main electrode and said short circuit electrode.

2. The MOS field effect transistor according to claim 1, wherein a withstand voltage between said fourth semiconductor region and said semiconductor substrate is set lower than a withstand voltage between said fourth semiconductor region and said third semiconductor region.

3. The MOS field effect transistor according to claim 1, wherein said third semiconductor region is a source region, and said fourth semiconductor region is a drain region.

4. A MOS field effect transistor wherein a current path extends from a first principal plane of a semiconductor substrate to a second principal plane opposite to the first principal plane, said MOS field effect transistor comprising:

a semiconductor substrate of first conductive type having a first principal plane and a second principal plane opposite to said first principal plane;

a first semiconductor region of said first conductive type formed on said first principal plane of said semiconductor substrate;

a body region of said first conductive type formed in said first semiconductor region;

a source region of second conductive type Formed in said body region;

a drain region of said second conductive type formed in said first semiconductor region opposite to said source region by sandwiching part of said body region;

a drift region of said second conductive type formed in said first semiconductor region sandwiched between said drain region and said body region, said drift region being shallower than said drain region;

a gate electrode formed, via a gate insulator, on said body region sandwiched between said source region and said drain region;

a drain electrode connected to said drain region;

a source electrode formed on said second principal plane of said semiconductor substrate;

a second semiconductor region of said first conductive type formed up to said semiconductor substrate from the surface of said first semiconductor region near said source region; and a short circuit electrode formed on said source region and on said second semiconductor region, wherein said drain electrode is formed on said gate electrode and on said short circuit electrode with an insulator interposed between said drain electrode and said gate electrode, and also interposed between said drain electrode and said short circuit electrode.

5. The MOS field effect transistor according to claim 4, wherein a withstand voltage between said drain region and said semiconductor substrate is set lower than a withstand voltage between said drain region and said source region.

6. The MOS field effect transistor according to claim 1, wherein said short circuit electrode includes a metal layer.

7. The MOS field effect transistor according to claim 4, wherein said short circuit electrode includes a metal layer.

8. A MOS field effect transistor wherein a current path extends from a first principal plane of a semiconductor substrate to a second principal plane opposite to the first principal plane, said MOS field effect transistor comprising:

a semiconductor substrate of first conductive type having a first principal plane and a second principal plane opposite to said first principal plane;

a first semiconductor region of said first conductive type formed on said first principal plane of said semiconductor substrate;

a second semiconductor region of said first conductive type formed in said first semiconductor region;

a third semiconductor region of second conductive type formed in said second semiconductor region;

a fourth semiconductor region of said second conductive type formed in said first semiconductor region opposite to said third semiconductor region by sandwiching part of said second semiconductor region;

a fifth semiconductor region of said second conductive type formed in said first semiconductor region sandwiched between said fourth semiconductor region and said second semiconductor region, a junction between said fifth semiconductor region and said first semiconductor region being located at a position shallower than a position of a junction between said fourth semiconductor region and said first semiconductor region;

a gate electrode formed, via a gate insulator, on said second semiconductor region sandwiched between said third semiconductor region and said fifth semiconductor region;

a first main electrode connected to said fourth semiconductor region;

a second main electrode formed on said second principal plane of said semiconductor substrate;

a sixth semiconductor region of said first conductive type extending to said semiconductor substrate from the surface of said first semiconductor region near said third semiconductor region; and a short circuit electrode formed on said third semiconductor region and on said sixth semiconductor region, wherein said first main electrode is formed on said gate electrode and on said short circuit electrode with an insulator interposed between said first main electrode and said gate electrode, and also interposed between said first main electrode and said short circuit electrode.

* * * * *